(12) United States Patent
Xu

(10) Patent No.: US 12,446,341 B2
(45) Date of Patent: Oct. 14, 2025

(54) SPECTRALLY FILTERED PHOTODIODE PAIR

(71) Applicant: UNIVERSITY OF MASSACHUSETTS, Boston, MA (US)

(72) Inventor: Guangyu Xu, Amherst, MA (US)

(73) Assignee: University of Massachusetts, Boston, MA (US)

( * ) Notice: Subject to any disclaimer, the term of this patent is extended or adjusted under 35 U.S.C. 154(b) by 810 days.

(21) Appl. No.: 17/678,259

(22) Filed: Feb. 23, 2022

(65) Prior Publication Data

US 2022/0278152 A1  Sep. 1, 2022

Related U.S. Application Data

(60) Provisional application No. 63/154,867, filed on Mar. 1, 2021.

(51) Int. Cl.
| | |
|---|---|
| *C12N 15/115* | (2010.01) |
| *G01N 33/58* | (2006.01) |
| *G01N 33/68* | (2006.01) |
| *H01L 27/146* | (2006.01) |
| *H10F 39/00* | (2025.01) |
| *H10F 39/18* | (2025.01) |

(52) U.S. Cl.
CPC ....... *H10F 39/8053* (2025.01); *C12N 15/115* (2013.01); *G01N 33/582* (2013.01); *G01N 33/6863* (2013.01); *H10F 39/024* (2025.01); *H10F 39/182* (2025.01)

(58) Field of Classification Search
CPC .. H10F 39/8053; H10F 39/182; H10F 39/024; C12N 15/115; G01N 33/582; G01N 33/6863
See application file for complete search history.

(56) References Cited

U.S. PATENT DOCUMENTS

| | | | |
|---|---|---|---|
| 2010/0102366 A1* | 4/2010 | Lee | H10F 39/807 257/E31.073 |
| 2012/0001289 A1* | 1/2012 | Ahn | H10F 39/8053 257/E31.128 |
| 2019/0170921 A1* | 6/2019 | Ockenfuss | G02B 5/281 |

OTHER PUBLICATIONS

Xiong, Z. et al., "Spectrally filtered passive Si photodiode array for on-chip fluorescence imaging of intracellular calcium dynamics," Scientific Reports, 2019; pp. 1-9.

* cited by examiner

*Primary Examiner* — Jill A Warden
*Assistant Examiner* — Michael Stanley Gzybowski
(74) *Attorney, Agent, or Firm* — Stites & Harbison, PLLC

(57) ABSTRACT

A spectrally filtered photodiode pair includes a substrate having a first photodiode and a second photodiode, wherein the first photodiode is positioned adjacent to the second photodiode. The spectrally filtered photodiode pair further includes a first spectral filter positioned over the first photodiode and a second spectral filter positioned over the second photodiode. The first and second spectral filters comprise particular absorbing dye compositions described herein, selected to filter preselected wavelengths of light. The spectrally filtered photodiode pair can be useful in sensors, particularly when rapid and low-concentration detection is needed.

18 Claims, 15 Drawing Sheets

SPECTRALLY FILTERED PHOTODIODE PAIR

CROSS REFERENCE TO RELATED APPLICATION

This application claims priority to U.S. Provisional Patent Application No. 63/154,867, filed on Mar. 1, 2021, in the United States Patent and Trademark Office, and all the benefits accruing therefrom under 35 U.S.C. § 119, the content of which is incorporated herein in its entirety by reference.

FEDERAL RESEARCH STATEMENT

This invention was made with government support under Grant Number ECCS-1835268 awarded by the National Science Foundation. The government has certain rights in the invention.

BACKGROUND

Immune response monitoring is essential in point-of-care (POC) applications such as the critical care of patients with acute immune responses. Many human immune responses are associated with cytokine release syndrome, which needs to be timely identified by biosensors that can offer robust readout. For instance, cytokine monitoring is significant to COVID-19 patients because excessive release of inflammatory cytokines in blood such as interleukin 6 (IL-6), interferon-gamma (IFN-γ), and C-reactive protein (CRP) can be a fatal immune response if not timely identified, and needs to be closely monitored during the clinical treatment or vaccine development.

Accordingly, there remains a continuing need for improved cytokine sensing devices. It would be particularly advantageous to provide an improved sensor having a low limit of detection and capable of rapid detecting (e.g., less than 10 minutes).

SUMMARY

A spectrally filtered photodiode pair comprises a substrate comprising a first photodiode and a second photodiode, wherein the first photodiode is positioned adjacent to the second photodiode; a first spectral filter positioned over the first photodiode; and a second spectral filter positioned over the second photodiode; wherein the first spectral filter comprises a first absorbing dye composition capable of absorbing light at a first wavelength, absorbing light at a second wavelength, and passing light at a third wavelength that is different from the first and second wavelengths; and wherein the second spectral filter comprises a second absorbing dye composition capable of absorbing light at the first wavelength, passing light at the second wavelength; and absorbing light the third wavelength.

In an aspect, a photodiode array comprises the spectrally filtered photodiode pair.

In an aspect, a method of making the spectrally filtered photodiode pair comprises disposing the first passivation layer on a surface of the substrate and encompassing the first and second photodiodes; disposing the first absorbing dye composition on the first passivation layer to provide a first spectral layer; heating the first spectral layer under conditions effective to thermally crosslink the first spectral layer; selectively patterning the first spectral layer to provide the first spectral filter positioned over the first photodiode; disposing a second passivation layer on the first spectral filter and on exposed portions of the first passivation layer, disposing the second absorbing dye composition on the second passivation layer to provide a second spectral layer; heating the second spectral layer under conditions effective to thermally crosslink the first spectral layer selectively patterning the second spectral layer to provide the second spectral filter positioned over the second photodiode; and disposing a third passivation layer on the second spectral filter and on exposed portions of the second passivation layer.

A device comprises the spectrally filtered photodiode pair.

A method of detecting a biological moiety in a sample comprises exposing the device comprising the spectrally filtered photodiode pair to the sample, wherein the DNA aptamer of the device is specific to the biological moiety; and determining a ratio of the second wavelength of light emitted by the first fluorescent dye to the third wavelength of light emitted by the second fluorescent dye; wherein a change in the ratio relative to an initial ratio of the second wavelength of light emitted by the first fluorescent dye to the third wavelength of light emitted by the second fluorescent dye determined in the absence of the sample indicates the presence of the biological moiety.

The above described and other features are exemplified by the following figures and detailed description.

BRIEF DESCRIPTION OF THE DRAWINGS

The following figures are exemplary embodiments.

DETAILED DESCRIPTION

Figure 1:
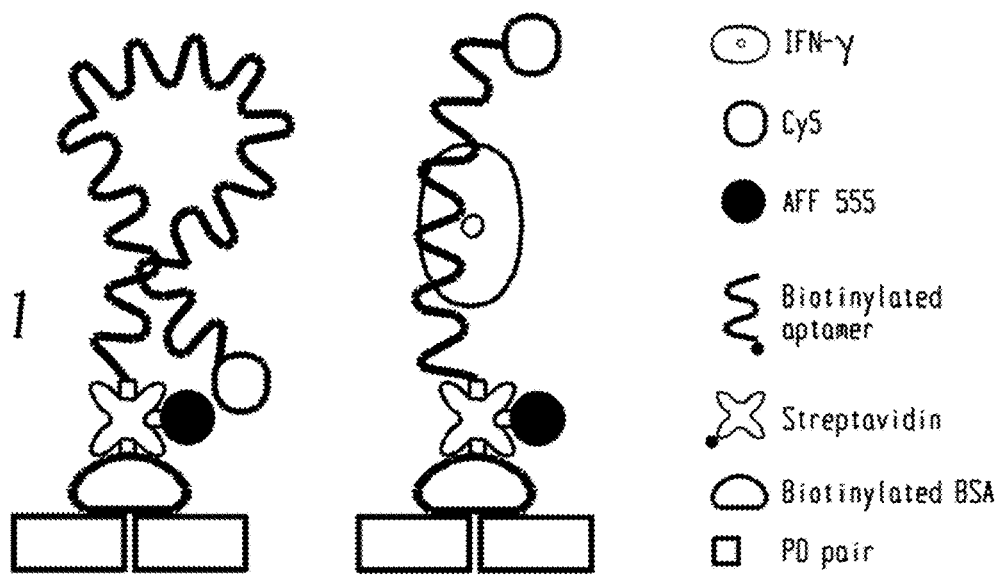
FIG. 1 is a schematic illustration of on-chip ratiometric aptasensing of interferon gamma (IFN-γ) with a spectrally filtered photodiode (PD) pair.

A cytokine biosensor should: 1) be miniaturized for integration purposes; 2) record cytokine dynamics in a label-free manner; and 3) feature crucial attributes such as low limit-of-detection, low drift, and high specificity. Yet, these requirements have not been simultaneously met in existing sensing technologies. For instance, most electrochemical cytokine sensors suffer from signal drifting and device-to-device variation, and often require costly research-grade potentiostats. On the other hand, known optical cytokine sensors are noted for their robust operation, however limited by bulky optical readout and costly labeling steps. To overcome these limitations, the ratiometric aptasensing strategy, in which the aptamer-cytokine binding events are quantified by the fluorescence ratio of donors and acceptors in a Förster resonance energy transfer (FRET) pair, has been recognized for its label-free operation, reduced baseline drift, and less device-to-device variations. If such sensing strategy can be achieved in devices with compact optical readout, cytokine dynamics can be monitored in a miniaturized POC testing system, which will in the long term make an impact for personalized medicine.

To enable miniaturized ratiometric aptasensing, one pair of photodetectors should be placed next to each other, ideally built in a chip scale, and integrated with distinct on-chip spectral filters to detect the emission light of select donors and acceptors. To achieve this, the two on-chip filters need to be site-selectively patterned onto each of the two photodetectors. To assure high wavelength selectivity of the device, the transmittance spectra of these two filters need to feature: 1) low optical crosstalk to each other, 2) high rejection of the targeted excitation light; and 3) high transmittance of the targeted emission light.

The present inventor has advantageously discovered an on-chip ratiometric aptasensing device to monitor the dynamics of an immune response biomarker, e.g., interferon-gamma (IFN-γ), in a label-free manner in real time. The device of the present disclosure comprises a pair of spectrally filtered silicon photodiodes that can be surface functionalized with aptamer probes, which can detect two-color fluorescence changes resulting from aptamer-cytokine binding events quickly (e.g., within three minutes) at picomolar levels, which is sufficient to capture the cytokine transients in point-of-care settings. Furthermore, the aptasensing device can be reset to baseline by simple washing steps, yielding consistent readout in consecutive runs. Combined with its chip-scale construct and high specificity, the present cytokine sensors may have possible use in point-of-care and therapeutic screening applications.

Accordingly, an aspect of the present disclosure is a spectrally filtered photodiode pair. The spectrally filtered photodiode pair can rapidly detect two-color fluorescence changes at picomolar levels. The spectrally filtered photodiode pair comprises a substrate having a first photodiode and a second photodiode disposed thereon. The substrate can be any suitable semiconducting metal, and preferably comprises silicon, silicon oxide, or a combination thereof. In an aspect, the substrate comprises a combination of silicon and silicon oxide.

As used herein, the term "photodiode", "first photodiode", and "second photodiode" refer to a bare photodiode (e.g., which is not modified with a spectral filter of the present disclosure). The term "photodiode pair" refers to a pair comprising the bare first photodiode and the bare second photodiode, wherein each of the first photodiode and the second photodiode are not modified by the spectral filters. The term "spectrally filtered photodiode pair" refers to the first photodiode and the second photodiode having the first and second spectral filters (respectively) positioned thereover.

The first and second photodiodes can be disposed directly on the substrate. In an aspect, one or more intervening layers can be disposed between the surface of the substrate and the first and second photodiodes. Suitable intervening layers could be determined by the skilled artisan without undue experimentation. In an aspect, a layer comprising a material suitable as a contact for n-doped alpha silicon (e.g., chromium) can be disposed between the substrate and the first and second photodiodes. In an aspect, a layer comprising a p-metal can be disposed directly on the surface of the photodiodes. For example, indium tin oxide (ITO) can be disposed on the surface of the first and the second photodiode.

The first and second photodiodes can each comprise p-i-n amorphous silicon. The p-i-n amorphous silicon comprises three superimposed layers which include a p-doped layer, an intrinsic (i) layer, and an n-doped layer. The p-doped, un-doped, and n-doped layers can be deposited sequentially, for example using a plasma enhanced chemical vapor deposition techniques to deposit the p-i-n amorphous silicon on the surface of the substrate. In an aspect, the n-doped layer can have a thickness of 30 to 50 nm, the un-doped (i) layer can have a thickness of 500 to 750 nm, and the p-doped layer can have a thickness of 30 to 50 nm. The distinct first and second photodiodes can be patterned by etching (e.g., reactive ion etching) the p-i-n amorphous silicon layer.

In general, the first and second photodiodes can be of any suitable shape and size. In an aspect, the first and second photodiodes can have a pixel size of 100 to 150 μm by 275 to 325 µm, for example 120×300 µm. The first and second photodiodes can each have a height of 560 to 850 nm.

The first photodiode and the second photodiode can be separated by a distance of 1 to 50 µm, or 5 to 30 µm, or 10 to 25 µm, or 15 to 25 µm. Other separation distances are also contemplated, where the minimum distance of separation can be determined based on the resolution of the patterning technique used for fabrication of the photodiodes. The distance can be the horizontal distance, for example the distance between the first photodiode and the second photodiode when viewed from the top down.

The spectrally filtered photodiode pair further comprises a first spectral filter positioned over the first photodiode and a second spectral filter positioned over the second photodiode. The first and second spectral filters can be in the same or different horizontal layers of the spectrally filtered photodiode pair. In an aspect, the first and second spectral filters are in different horizontal layers. The first and second spectral filters being positioned over the first and second photodiodes are therefore also positioned adjacent to each other (e.g., when viewed from the top of the PD pair). They do not overlap, and can generally have the same spacing (e.g., when viewed from the top of the PD pair) as the first and second photodiodes, as described above.

Thus the first spectral filter is positioned selectively over the first photodiode. The first spectral filter can have a thickness of 1 to 5 µm, or 1 to 4 µm, or 1.5 to 3.5 µm, or 2 to 3 µm.

The first spectral filter comprises a first absorbing dye composition. The first absorbing dye composition is capable of absorbing (e.g., blocking) light at a first wavelength, absorbing (e.g., blocking) light at a second wavelength, and passing (e.g., transmitting) light at a third wavelength that is different from the first and second wavelengths. The first wavelength, the second wavelength, and the third wavelength are different. In an aspect, the first wavelength of light is less than the second and the third wavelengths of light. In an aspect, the third wavelength of light is greater than the first wavelength of light and less than the third wavelength of light. In an aspect, the first wavelength can be 550±15 nanometers. In an aspect, the second wavelength can be 666±15 nanometers. In an aspect, the third wavelength can be 580±15 nanometers.

The first absorbing dye composition comprises at least one absorbing dye and a photoresist. The composition can be selected by the skilled artisan so as to meet the requirements set forth above with respect to the ability to block or transmit various wavelengths of light (i.e., to act as a filter). In an aspect, the first absorbing dye composition comprises a first absorbing dye, a second absorbing dye, a third absorbing dye, and a photoresist. The first absorbing dye, the second absorbing dye, and the third absorbing dyes can each have different absorption maximums. In an aspect, the first absorbing dye can have an absorption maximum at 540 to 550 nanometers. In an aspect, the second absorbing dye can have an absorption maximum at 630 to 640 nanometers. In an aspect, the third absorbing dye can have an absorption maximum of 665 to 675 nanometers. Suitable first, second and third absorbing dyes meeting the criteria described herein can be selected by the skilled artisan with the present disclosure as a guide. Exemplary first, second and third absorbing dyes are Epolight 5391, 5262 and 6661, respectively, all of which are commercially available from Epolin.

The photoresist can be any photoresist material that is generally known. The photoresist can be a positive photoresist material or a negative photoresist material. In an aspect, the photoresist can be a negative photoresist material. An exemplary negative photoresist material that can be used in the first absorbing dye composition can be NR9-1000PY available from Futurrex, Inc. The presence of the photoresist can enable the selective patterning to form the spectral filters positioned selectively over the desired photodiodes, as further described in detail below.

In an aspect, the first absorbing dye composition can comprise 1 to 5 weight percent of the first absorbing dye; 0.1 to 1 weight percent of the second absorbing dye; 1 to 5 weight percent of the third absorbing dye; and 89 to 97.9 weight percent of the photoresist; wherein weight percent is based on the total weight of the second absorbing dye composition.

In an aspect, the first spectral filter is crosslinked. Stated another way, the first absorbing dye composition can be chemically crosslinked to provide a crosslinked spectral filter.

The spectrally filtered photodiode pair further comprises the second spectral filter positioned selectively over the second photodiode. The second spectral filter can have a thickness of 1 to 5 µm, or 1 to 4 µm, or 1.5 to 3.5 µm, or 2 to 3 µm.

The second spectral filter comprises a second absorbing dye composition. The second absorbing dye composition is capable of absorbing (e.g., blocking) the light at the first wavelength, passing (e.g., transmitting) light at the second wavelength, and absorbing (e.g., blocking) light the third wavelength. The first, second, and third wavelengths of light are the same as described above in reference to the first spectral filter.

The second absorbing dye composition comprises at least one absorbing dye and a photoresist. The composition can be selected by the skilled artisan so as to meet the requirements set forth above with respect to the ability to block or transmit various wavelengths of light (i.e., to act as a filter, specifically for a wavelength of light different from what is filtered by the first spectral filter). In an aspect, the second absorbing dye composition comprises a first absorbing dye, a second absorbing dye, and a photoresist. The first absorbing dye and the second absorbing dye each have different absorption maximums. In an aspect, the first absorbing dye can have an absorption maximum at 540 to 550 nanometers. In an aspect, the second absorbing dye can have an absorption maximum at 570 to 580 nanometers. Suitable first and second absorbing dyes meeting the criteria described herein can be selected by the skilled artisan with the present disclosure as a guide. Exemplary first and second absorbing dyes are Epolight 5391 and 5822, respectively, both commercially available from Epolin.

The photoresist can be any photoresist material that is generally known and can be the same or different from the photoresist of the first absorbing dye composition. In an aspect, the photoresist is the same as the photoresist of the first absorbing dye composition.

In an aspect, the second dye absorbing composition can include 1 to 5 weight percent of the first absorbing dye; 1 to 5 weight percent of the second absorbing dye; and 90 to 98 weight percent of the photoresist; wherein weight percent is based on the total weight of the first absorbing dye composition.

In an aspect, the second spectral filter can be crosslinked. Stated another way, the second absorbing dye composition can be chemically crosslinked to form a crosslinked spectral filter.

The first spectral filter and the second spectral filter are positioned selectively over the first photodiode and the second photodiode, respectively. In an aspect, the first spectral filter and the second spectral filter are separated by a distance equivalent to the distance separating the first photodiode and the second photodiode. In an aspect, the first spectral filter and the second spectral filter are separated by a distance of 1 to 50 μm, or 5 to 30 μm, or 10 to 25 μm, or 15 to 25 μm. The distance referred to here is shown as "D" in FIG. 3. The first spectral filter and the second spectral filter do not overlap.

It should be noted that as used herein, the terms "first" and "second" are used to aid in the identification of the various components of the spectrally filtered photodiode pair, and should not be construed as limiting the positioning of the components within the spectrally filtered photodiode pair. For example, one or more intervening layers can be present, and the arrangement of the first and second spectral filters can be adjusted with the proviso that they do not overlap (horizontally, when viewed from the top), and that they are positioned selectively over a photodiode.

In a specific aspect, the spectrally filtered photodiode pair can comprise the substrate comprising the first photodiode and the second photodiode. The spectrally filtered photodiode pair can further comprise a first passivation layer. The first passivation layer can be disposed on the surface of the substrate and on the first and second photodiodes, such that the first and second photodiodes are encompassed in the first passivation layer. A passivation layer refers to a layer which can render the underlying components "passive", or less-affected by any future processing or working conditions, and can therefore reduce or prevent undesired degradation. Thus the passivation layer is generally inert. The first passivation layer can comprise any passive materials generally known in the art, provided that they are optically transparent, particularly with respect to the first, second, and third wavelengths of light discussed previously. In an aspect, the first passivation layer can comprise an epoxy, for example an epoxy-containing negative photoresist capable of being crosslinked upon exposure to ultra-violet (UV) light. An exemplary epoxy material is known as SU-8, a bisphenol A novolac epoxy having eight epoxy groups. SU-8 is of the structure

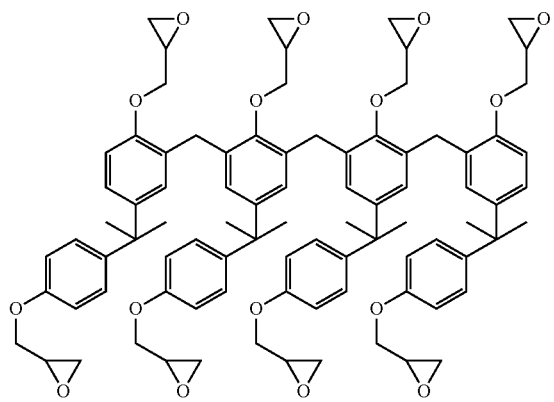

The first passivation layer can have a thickness of 2 to 10 μm, or 2 to 7 μm, or 2 to 5 μm at the thickest point. Stated another way, the distance from the surface of the substrate to the opposite surface of the first passivation layer can be 2 to 10 μm. It is understood that the first passivation layer may be thinner in an area directly over the photodiodes in order to provide a continuous, smooth surface.

The first spectral filter can be disposed on the first passivation layer and positioned selectively over the first photodiode.

The spectrally filtered photodiode pair can further comprise a second passivation layer. The second passivation layer can be disposed on the first spectral filter, as well as on exposed portions of the first passivation layer. The second passivation layer can have a composition that is the same or different from the first passivation layer. The second passivation layer can have a thickness of 2 to 10 μm, or 2 to 7 μm, or 2 to 5 μm at the thickest point. Stated another way, the distance from the surface of the first passivation layer to the opposite surface of the second passivation layer can be 2 to 10 μm. It is understood that the second passivation layer may be thinner in an area directly over the first spectral filter in order to provide a continuous, smooth surface.

The second spectral filter can be disposed on the second passivation layer and positioned selectively over the second photodiode.

The spectrally filtered photodiode pair can further comprise a third passivation layer. The third passivation layer can be disposed on the second spectral filter and on exposed portions of the second passivation layer. The third passivation layer can have a composition that is the same or different from the first and second passivation layers. The third passivation layer can have a thickness of 2 to 10 μm, or 2 to 7 μm, or 2 to 5 μm at the thickest point. Stated another way, the distance from the surface of the second passivation layer to the opposite surface of the third passivation layer can be 2 to 10 μm. It is understood that the third passivation layer may be thinner in an area directly over the second spectral filter in order to provide a continuous, smooth surface.

As mentioned above, the use of the terms "first" and "second" should not be construed as limiting the positioning of the components within the spectrally filtered photodiode pair. For example, it will be understood that in an aspect, the second spectral filter as defined herein can be disposed on the first passivation layer and the first spectral filter as defined herein can be disposed on the second passivation layer.

In another specific aspect, the spectrally filtered photodiode pair can comprise the substrate having the first photodiode and the second photodiode disposed thereon. The spectrally filtered photodiode pair can further comprise the first passivation layer disposed on the surface of the substrate and on the first and second photodiodes, such that the first and second photodiodes are encompassed in the first passivation layer. The second spectral filter can be disposed on the first passivation layer and positioned selectively over the second photodiode. The second passivation layer can be disposed on the second spectral filter, as well as on exposed portions of the first passivation layer. The first spectral filter can be disposed on the second passivation layer and positioned selectively over the first photodiode. The third passivation layer can be disposed on the first spectral filter and on exposed portions of the second passivation layer.

Figure 3:
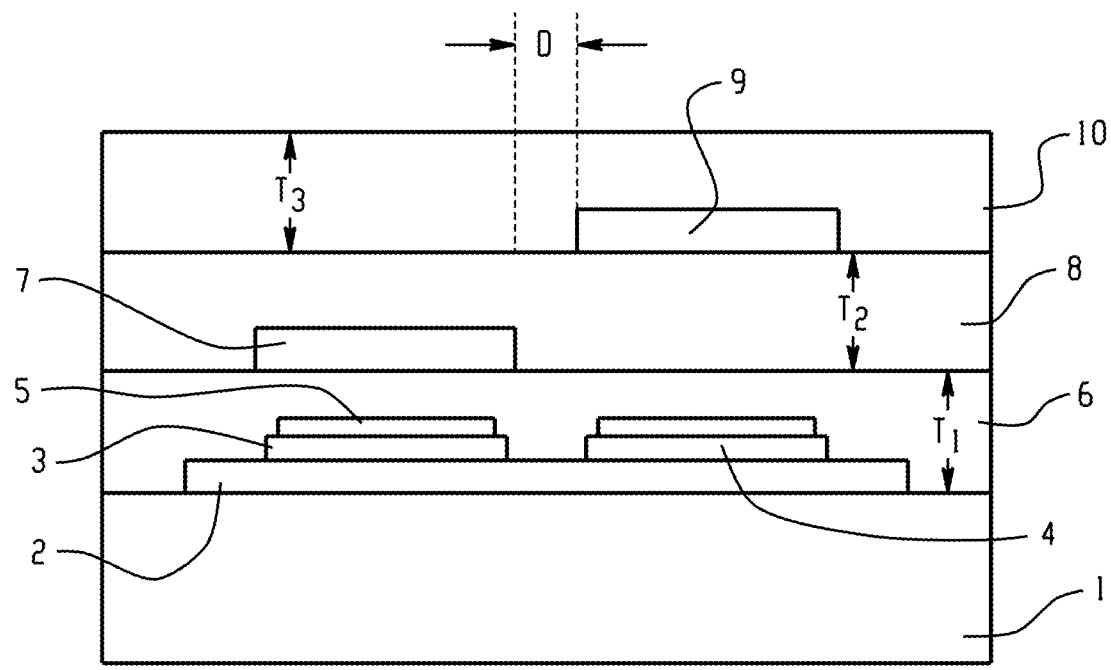
FIG. 3 is a cross-sectional view of a spectrally filtered PD pair (top) and the microscopic view of PD array (scale bar, 100 μm). It is noted that in this side view the spectral filters appear to be stacked, however this is only due to the angle of viewing, and they are actually offset as in the schematic illustration.
Figure 3:
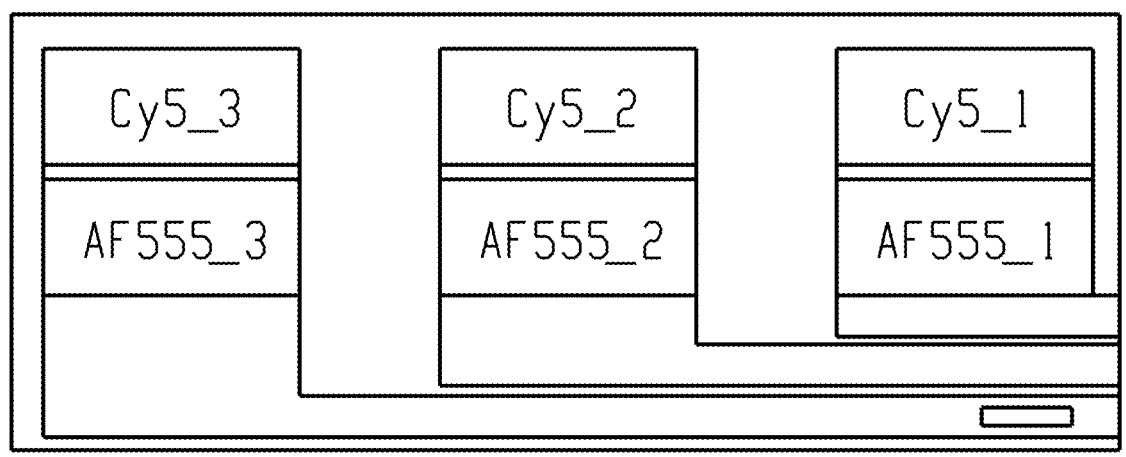

A spectrally filtered photodiode according to an aspect is shown in FIG. 3. As shown in FIG. 3, a layer of an n-metal (2) is disposed on a silicon/silicon oxide substrate (1). P-I-N amorphous silicon is used to form the first and second photodiodes (3, 4, respectively), each further having a p-metal layer (5) disposed thereon. A first passivation layer (6) is disposed on the substrate, n-metal, silicon photodiodes, and p-metal, such that the resulting first passivation layer encompasses the each of the foregoing components and provides a barrier to the rest of the device. The thickness of the first passivation layer is shown as $T_1$. The first spectral filter (7) is disposed on the first passivation layer and positioned over the first photodiode. The second passivation layer (8) is disposed on the first passivation layer, and encompasses the first spectral filter, providing a barrier between the first spectral filter and adjacent layers. The thickness of the second passivation layer is shown as $T_2$. The second spectral filter (9) is disposed on the second passivation layer and positioned over the second photodiode. The third passivation layer (10) is disposed on the second passivation layer and encompasses the second spectral filter. The thickness of the third passivation layer is shown as $T_3$. The spacing between the first and second spectral filters is shown as D.

The photodiode pair can be used in a photodiode array. Thus a photodiode array comprising the spectrally filtered photodiode pair represents another aspect of the present disclosure. In an aspect, the photodiode array can comprise a plurality of the spectrally filtered photodiode pairs. Each first photodiode having a first spectral filter is positioned adjacent to a second photodiode having a second spectral filter (e.g., to form the spectrally filtered photodiode pair). Each spectrally filtered photodiode constitutes one pixel of the photodiode array.

The spectrally filtered photodiode pair can be made by any suitable method for providing the first spectral filter positioned over the first photodiode and providing the second spectral filter positioned over the second photodiode. In an aspect, the spectrally filtered photodiode pair can be made by a method comprising disposing a first passivation layer on the surface of the substrate comprising the first and second photodiodes, and optionally, any intervening layers as described above. The first absorbing dye composition can be disposed on the first passivation layer to form a first spectral layer. Any coating technique that is generally known can be used. In an aspect, the first absorbing dye composition can be disposed on the first passivation layer by spin coating. The first spectral layer is heated under conditions effective to thermally crosslink the first spectral layer, for example to a temperature of 125 to 175° C., preferably 145 to 155° C. for 1 to 5 hours, preferably 1 to 3 hours. Following thermally crosslinking the first spectral layer, the first spectral layer is selectively patterned to provide the first spectral filter positioned over the first photodiode. Selectively patterning can be by any etching technique that is generally known. For example, in an aspect, reactive ion etching can be used to define the first spectral filter over a select area (e.g., positioned over the first photodiode). A second passivation layer is then disposed over the first spectral filter and on exposed portions of the first passivation layer. The presence of the second passivation layer effectively serves to protect the first spectral filter during subsequent processing of the second spectral filter, such that the first spectral filter remains intact. The second absorbing dye composition is then disposed on the second passivation layer to provide the second spectral layer. The second spectral layer is subjected to similar thermal treatment as described for the first spectral layer to effect crosslinking of the second spectral layer. Following the thermal crosslinking, the second spectral layer is selectively patterned to provide the second spectral filter positioned over the second photodiode. Selectively patterning can be by any etching technique that is generally known. For example, in an aspect, reactive ion etching can be used to define the second spectral filter over a select area (e.g., positioned over the second photodiode). A third passivation layer is disposed on the second spectral filter and on exposed portions of the second passivation layer to provide the spectrally filtered photodiode pair.

An exemplary method of making the spectrally filtered photodiode pair is further described in the working examples below.

A schematic illustration of a method of making the spectrally filtered photodiode pair is shown and described in FIG. 13. As shown in FIG. 13, a bare photodiode array including a substrate 1300, a first photodiode 1301, and a second photodiode 1302 (shown in (a)) is passivated by a first passivation layer 1303 (shown in (b)). Next, a first absorbing dye composition 1304 was spin-coated over the entire passivated array, and thermally crosslinked (as shown in (c)), followed by patterning by reactive ion etching (RIE) to define the first spectral filter 1305 over the first photodiode 1301 (as shown in (d)). The resulting array is then again passivated with the second passivation layer 1306 (as shown in (e)), and the second absorbing dye composition 1307 is disposed on the second passivation layer and thermally crosslinked (as shown in (f)) and selectively patterned by reactive ion etching (RIE) to define the second spectral filter 1308 over the second photodiode (as shown (g)). Finally, a third passivation layer 1309 is disposed on the array (as shown in (h)).

The spectrally filtered photodiode pair (or the photodiode array comprising the spectrally filtered photodiode pair) can be particularly useful in various devices for sensing applications. In an aspect, a device comprising the spectrally filtered photodiode pair can be a biosensor, or more particularly, an aptasensor.

In an aspect, the device can be an aptasensor, wherein an aptamer is disposed on the spectrally filtered photodiode pair. As used herein, the term "aptamer" refers to an oligonucleotide that binds to a specific target molecule. Thus the aptamer can be selected for its specificity for a biological moiety of interest, enabling detection of the presence of the biological moiety. For example, in an aspect, the aptamer can be specific to a cytokine. In an aspect, the aptamer can be specific for interferon gamma (IFN-γ). In an aspect, the aptamer can be TTTCCCCAACCTGTGTTGTGGG-TTGTGTTGGTTGGGG, wherein "T", "C", "A" and "G" refer to thymine, cytosine, adenine, and guanine nucleotides, respectively.

The aptasensor comprises a first fluorescent dye and a second fluorescent dye, wherein the first fluorescent dye and the second fluorescent dye are capable of forming a Förster resonance energy transfer (FRET) pair. The first and second fluorescent dyes being a FRET pair means that the second fluorescent dye is capable of being excited by an excitation light (which can be the light at the first wavelength, described above). Upon excitation, the second fluorescent dye can emit an emission light (which can be, for example, the light at the third wavelength, described above, also referred to as a "second emission light" in the context of the sensor). The first fluorescent dye is capable of being excited by the light emitted from the second fluorescent dye (but not by the aforementioned excitation light). Upon excitation, the first fluorescent dye emits light (which can be, for example, the light at the second wavelength, described above, also referred to as the "first emission light" in the context of the sensor). Thus the second fluorescent dye can be a FRET donor and the first fluorescent dye can be a FRET acceptor. Thus, in order for the first fluorescent dye to be excited by the emission from the second fluorescent dye, the first and second fluorescent dyes must be sufficiently close (e.g., 1 to 10 nm). The strength of the first emission from the first fluorescent dye will thus depend on the proximity of the second fluorescent dye (e.g., stronger first emission indicates that the first and second fluorescent dyes are positioned in close proximity). Likewise, the strength of the second emission from the second fluorescent dye detected will depend on the proximity of the first fluorescent dye (e.g., stronger second emission indicates that the first and second fluorescent dyes are positioned too far apart to result in efficient energy transfer).

A variety of FRET donors and acceptors can be suitable for use in the sensor of the present disclosure. The compositions of the first and second spectral filters can be adjusted accordingly based on the selection of the FRET dye pair used for the sensing.

In an aspect, the first emission light (e.g., light at the second wavelength) of the first fluorescent dye can be at a wavelength of 666±15 nanometers. In an aspect, the first fluorescent dye can comprise a cyanine dye. For example, the first fluorescent dye can be cyanine 5 or cyanine 7.

In an aspect, the second emission light (e.g., light at the third wavelength) of the second fluorescent dye can be at a wavelength of 580±15 nanometers. In an aspect, the excitation light (e.g., light at the first wavelength) can be 550±15 nanometers. In an aspect, the second fluorescent dye can be 4-(3-amino-6-imino-4,5-disulfoxanthen-9-yl)benzene-1,3-dicarboxylic acid, for example having the structure

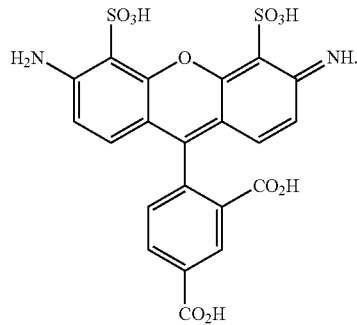 [SMILES: N=c1ccc2c(-c3ccc(C(=O)O)cc3C(=O)O)c3ccc(N)c(S(=O)(=O)O)c3oc-2c1S(=O)(=O)O]

An exemplary second fluorescent dye can be AlexaFluor555, which is commercially available.

It should be noted that the terms "first" and "second" which respect to the fluorescent dyes are used for facilitating discussion of the various components, and is not necessarily meant to be construed as limiting their position in the device or the direction of the energy transfer of the FRET process. Thus, an aspect could be envisioned in which the emission from the first fluorescent dye can be used to excite the second fluorescent dye.

Additional FRET pairs contemplated by the present disclosure and can include, but are not limited to, cyanine 5 as the donor and a phycoerythrin-cyanine 7 conjugate as the acceptor. In such an aspect, the first wavelength of light can be 649±15 nanometers, the second wavelength of light can be 774±15 nanometers, and the third wavelength of light can be 666±15 nanometers. In another aspect, AlexaFluor488 can be used as the donor and AlexaFluor594 can be used as the acceptor. In such an aspect, the first wavelength of light can be 490±15 nanometers, the second wavelength of light can be 617±15 nanometers, and the third wavelength of light can be 525±15 nanometers.

In the aptasensor of the present disclosure, the first and second fluorescent dyes can be positioned at opposing ends of the aptamer. One of the first or second fluorescent dyes is covalently conjugated to the aptamer at an end opposite the spectrally filtered PD pair. Thus the relative positioning of the first and second fluorescent dyes is sensitive to conformational changes of the aptamer.

In a specific aspect, the aptasensor of the present disclosure can comprise biotinylated bovine serum albumin (BSA) adsorbed on a surface of the spectrally filtered photodiode pair. Preferably, the BSA is positioned at least partially over the first and second photodiodes of the photodiode pair. Streptavidin comprising the second fluorescent dye can be bound to the biotinylated BSA (e.g., through interaction between the biotin of the BSA and the streptavidin). A biotinylated DNA aptamer is bound to the streptavidin (e.g., through interaction between the biotin of the aptamer and the streptavidin). The DNA aptamer comprises the first fluorescent dye at an end of the DNA aptamer that is opposite the strepatividin.

When the DNA aptamer is not bound to a biological moiety to which it has specificity, the DNA aptamer can be in a folded state where the first and second fluorescent dyes can be positioned such that sufficient energy transfer can occur between the dyes. When the DNA aptamer binds to a biological moiety, the DNA aptamer undergoes a conformational change to accommodate the biological moiety resulting in an extended state, separating the first and second fluorescent dyes, such that energy transfer is reduced. This is shown schematically in FIG. 1. Accordingly, a change in fluorescence can be observed upon binding of a biological moiety. Specifically, a change in a ratio of the second wavelength of light emitted by the first fluorescent dye to the third wavelength of light emitted by the second fluorescent dye relative to an initial ratio of the second wavelength of light emitted by the first fluorescent dye to the third wavelength of light emitted by the second fluorescent dye (e.g., not in the presence of the biological moiety) can indicate the presence, amount (e.g., concentration), or a change in concentration of the biological moiety. Thus the aptamer can be used for ratiometric sensing of a biological moiety. The change in fluorescence ratio can be detected by the spectrally filtered photodiode pair of the device. As noted above, the first spectral filter is designed to transmit the first emission light (e.g., light at the second wavelength emitter from the first fluorescent dye), and the second spectral filter is designed to transmit the second emission light (e.g., light at the third wavelength emitted from the second fluorescent dye).

The device of the present disclosure comprising the spectrally filtered photodiode pair can further include a microfluidic channel. The microfluidic channel can be configured to provide a sample to be analyzed to the spectrally filtered photodiode pair. In an aspect, the microfluidic channel can be used, for example, to introduce a sample to the device for detecting an analyte of interest. The device can include one or more microfluidic channels. In an aspect, the device can include more than one microfluidic channel, each microfluidic channel configured to provide a sample to be analyzed to separated portions of the device, each portion comprising one or more spectrally filtered photodiode pair.

In an aspect, the device can detect a biological moiety from a sample, wherein the biological moiety has a concentration of greater than or equal to 1 picomolar (pM).

A method of detecting a biological moiety of interest in a sample represents another aspect of the present disclosure.

The method can comprise contacting the device with the sample. The DNA aptamer of the device is selected to be specific to a biological moiety of interest. The method further comprises determining a ratio of the second wavelength of light emitted by the first fluorescent dye to the third wavelength of light emitted by the second fluorescent dye.

A a change in the ratio relative to an initial ratio of the second wavelength of light emitted by the first fluorescent dye to the third wavelength of light emitted by the second fluorescent dye determined in the absence of the sample indicates the presence of the biological moiety. In a specific aspect, the DNA aptamer can be specific for a cytokine, specifically IFN-γ.

Contacting the device with the sample can be, for example 10 minutes or less, or 7 minutes or less, or 6 minutes or less, or 5 minutes or less, for example 1 to 10 minutes, or 1 to 7 minutes, or 1 to 6 minutes, or 1 to 5 minutes.

In a particularly advantageous aspect, the device of the present disclosure can be regenerated or reset to its original state such that it can be used repeatedly to accurately detect the presence of a biological moiety. Resetting of the device can be, for example, by washing the device (e.g., with water).

Thus, the device of the present disclosure can be particularly useful for rapid bedside blood testing for a variety of health monitoring and therapeutic screening purposes.

This disclosure is further illustrated by the following examples, which are non-limiting.

EXAMPLES

PD Array Fabrication

Chromium (Cr) was patterned on a Si/SiO$_2$ substrate to serve as a contact for n-doped α-Si. Next, n-doped (n, 40 nm), un-doped (i, 600 nm) and p-doped (p, 40 nm) α-Si layers were sequentially deposited by plasma-enhanced chemical vapor deposition (PECVD) at 250° C. Subsequently, 2×3 photodiode (PD) arrays with 120×300 μm pixel sizes were patterned by reactive-ion etching and then passivated by a 30 nm Al$_2$O$_3$ film using atomic layer deposition (ALD) at 250° C. Buffered oxide etching was carried out to create contact openings, followed by sputtering of 120 nm indium tin oxide (ITO) to contact with p-doped α-Si. Finally, Au/Cr layers (10/200 nm, respectively) were deposited on the pad area for wire-bonding, and a 4 μm-thick EPON SU-8 epoxy (SU-8) layer was coated over the array for passivation. Before wire-bonding, two distinct photoresist-based spectral filters were sequentially patterned on 6 PD pixels, each with a 4 μm-thick SU-8 layer on top for protection. The first spectral filter was made by mixing visible light absorbing dyes Epolight 5391 (3.5 wt %), Epolight 5262 (0.25 wt %), and Epolight 6661 (3.5 wt %) (Epolin) with NR9-1000PY (Futurrex) photoresist and spin-coating (800 rpm, 40 s) on the PD pixels (2.8 μm thickness), followed by a 2 hours at 150° C. to effect thermal crosslinking to reduce the solubility of the layer in subsequent photoresist coatings. The crosslinked layer was then patterned via dry etching using a KL-6008 layer as an etch mask, and then passivated by a 4 μm-thick SU-8 layer. This process was repeated for the second spectral filter made by mixing visible light absorbing dyes Epolight 5391 (3.5 wt %) and Epolight 5822 (2.0 wt %) (Epolin) with NR9-1000PY (Futurrex) photoresist, and processed as described above. The spectrally filtered PD array was then wire-bonded to a printed circuit board and packaged with a PDMS microfluidic channel containing inlet and outlet holes. Tubing (Fisher Scientific) was inserted into the inlet and outlet holes for analyte injection and removal.

Device Characterization

To characterize the optical properties, the spectral filters were spin-coated onto 100 μm-thick glass coverslips (Fisher Scientific) and transmission was measured by an UV-vis-NIR spectrometer (SHIMADZU 3600).

The I-V measurement of PD pairs were measured by Keysight B1500A with 100 mV sweep step of $V_{bias}$; pixels were illuminated at 550/15 nm (260 mW at 100%), 575/25 nm (310 mW at 100%), or 640/30 nm (231 mW at 100%) wavelengths, provided by FN1 through a CFI6O Plan Achromat 10× objective lens (NA=0.25, Nikon). At the array level, an off-board multiplexing circuit was built in a homemade faradic cage, using two ADG406 multiplexers and two CD4029BMS counters to select pixels and bias them at $V_{bias}$=−5 V with Keysight B2902A. The pixel current was amplified to a voltage readout, $V_{out}$, by a low-noise preamplifier SR570 (Stanford Research Systems), followed by a Hum bug noise eliminator (A-M Systems) to remove 50/60 Hz noise. The preamplifier operated in the low noise mode, with 5 mA/V sensitivity, and a 100 Hz cutoff frequency of a low-pass signal filter (12 dB/octave to reduce the high-frequency noise in the recorded $V_{out}$ trace). All of which were optimized to maximize the SBR obtained from the $V_{sig}$ data. The resulting $V_{out}$-trace and the clock signal were recorded by an 8-channel with 256 MS buffer memory digital oscilloscope (Pico 4824).

DNA Functionalization

Analytes used in the experiments were as follows: 1 mg ml$^{-1}$ biotinylated BSA in ultrapure water; 0.2 mg ml$^{-1}$ AF555 labeled streptavidin in 1×PBS; 1 μM IFN-γ DNA aptamers in ultrapure water; 1×PBS and ultrapure water was purchased from ThermoFisher Scientific. Biotinylated BSA, streptavidin, and Alexa Fluor 555 fluorescence molecules labeled streptavidin was purchased from Sigma Aldrich. The recombinant human IFN-γ was purchased from R&D systems. IFN-γ DNA aptamers with 3' biotin modification and 5' cy5 fluorescence molecules modification were purchased from idtDNA. The DNA aptamer sequence was 3'-biotin-TTTCCCCAACCTGTGTTGTGGGTTGTGTTGGTTGG-GG-Cy5-5'.

All the analytes mentioned above were injected to the microfluidic channel by a pipettor with 200 μL tips with constant pressure. The 80 μL biotinylated BSA was introduced to spectrally filtered PD pairs for 1 h following with 9 ml deionized water washing (injected by a 5 ml syringe) at room temperature. 80 μL AF555 labeled streptavidin was then introduced for 10 min in the dark, following with 9 mL deionized water washing at room temperature. 80 μL IFN-γ NA aptamers was allowed 2 h for immobilization in the dark, following with 9 mL deionized water washing at room temperature. Prior to the biomolecule experiment the whole device was kept in deionized water and stored in the dark at room temperature.

Biomolecule Experiment

During the biomolecule detecting experiments, 80 μL IFN-γ and streptavidin was sequentially injected into the microfluidic channel at concentrations ranging from 0.1 pM to 1 nM in 1×PBS. To test the reusability, 15 mL deionized water at 55° C. was applied to the microfluidic channel to deeply remove the bounded IFN-γ. The 550/15 nm excitation light (with 260 mW at 100%) was applied using an epifluorescence upright microscope (FN1, Nikon) equipped with a SPECTRA X light engine (Lumencor). NIS-Elements Advanced Research software (Nikon) was used to automate microscope, light engine, and provide the clock signal.

Ratiometric Aptasensing of IFN-γ

The spectrally filtered PD pair was surface functionalized with biotinylated bovine serum albumin (BSA), Alexa Fluor 555 (AF555) conjugated streptavidin, and biotinylated Cy5-labeled DNA aptamer probe designed to specifically bind to IFN-γ. This aptamer probe will self-hybridize itself in the absence of IFN-γ binding, pulling Cy5 close to AF555 to form a FRET pair with AF555 [Cy5] being the donor [acceptor]. When IFN-γ binds to the aptamer probe, the structural change of the aptamer will separate Cy5 and AF555 apart, lessening the FRET effect (i.e., leading to an increase [decrease] of the AF555 [Cy5] emission signals under 550/15 nm excitation). A schematic description of the ratiometric aptasensor for IFN-γ is shown in FIG. 1.

Figure 2A:
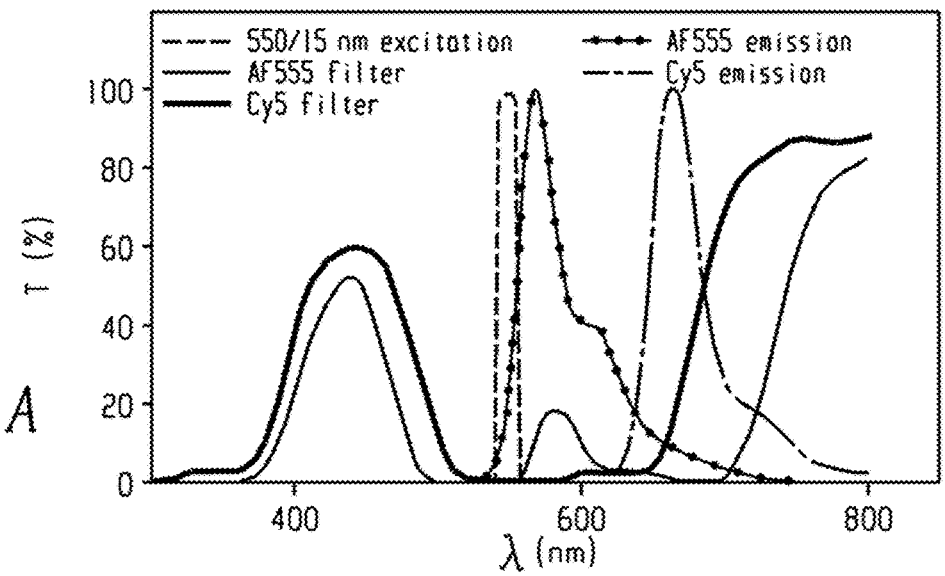
FIG. 2 illustrates filter design, including the 550/15 nm excitation spectrum, the emission spectra of AF555 and Cy5 fluorescence molecules (left), and the measured transmission spectra of AF555 and Cy5 filters (right).
Figure 2B:
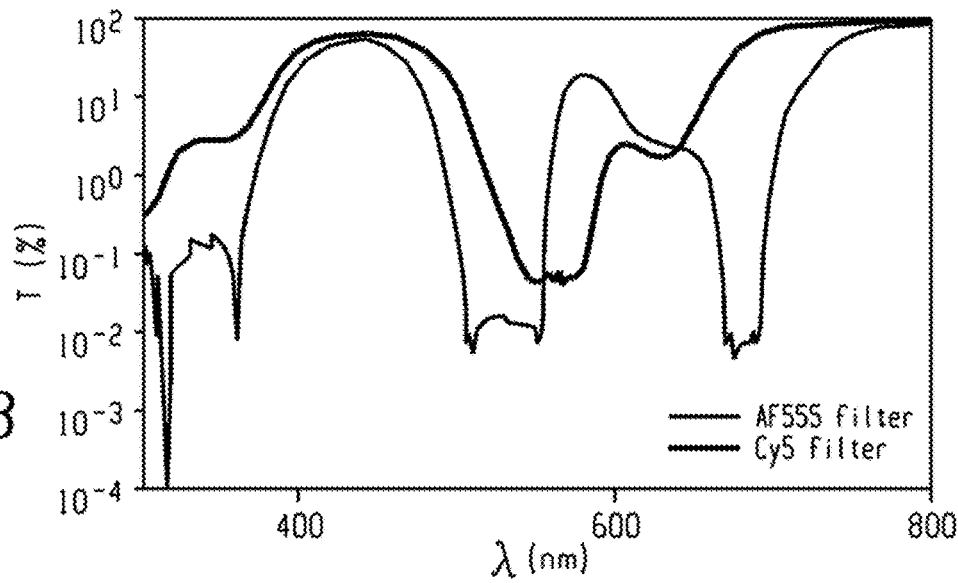

On the device side, the spectrally filtered Si PD arrays are based on 2-by-3 amorphous Si (α-Si) p-i-n diodes routed in a cross-bar structure as has been previously reported. See, e.g., Mao, D.; Morley, J.; Zhang, Z.; Donnelly, M.; Xu, G. High-Yield Passive Si Photodiode Array towards Optical Neural Recording. *IEEE Electron Device Lett.* 2018, 39 (4), 524-527; Xiong, Z.; Hwang, F.-J.; Sun, F.; Xie, Y.; Mao, D.; Li, G.-L.; Xu, G. Spectrally Filtered Passive Si Photodiode Array for On-Chip Fluorescence Imaging of Intracellular Calcium Dynamics *Sci. Rep.* 2019, 9 (1), 9083. Briefly, the Si PDs were built from plasma-enhanced chemical vapor deposition (PECVD) based α-Si layers, which were contacted by indium tin oxide (ITO) and Au/Cr layers at their p- and n-terminals, respectively. Two spectral filters were prepared by mixing light absorbing dyes into optically transparent photoresist. Here, an AF555 [Cy5] spectral filter was used which selectively 1) blocks the 550/15 nm excitation light (the numbers before and after the slash are the center wavelength and the bandwidth of the light source, respectively), 2) blocks the Cy5 [AF555] emission light, and 3) passes the AF555 [Cy5] emission light. The filter design, including the 550/15 nm excitation spectrum, the emission spectra of AF555 and Cy5 fluorescence molecules (left), and the measured transmission spectra of AF555 and Cy5 filters (right) is shown in FIGS. 2.

Figure 4:
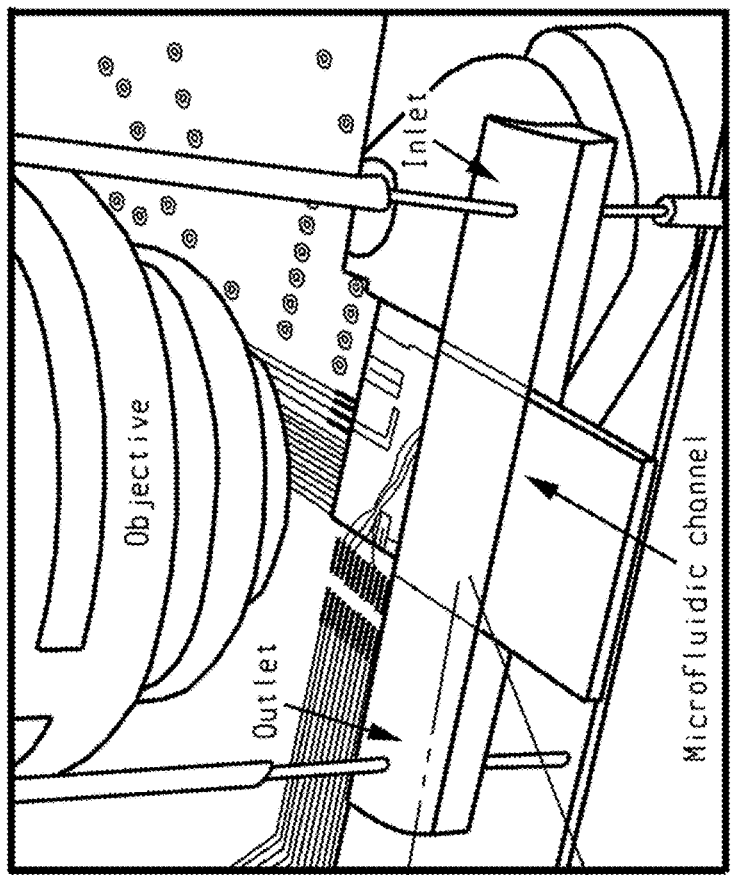
FIG. 4 is an illustration and image of aptasensing experimental setup of a PD array with a microfluidic channel on top.
Figure 4:
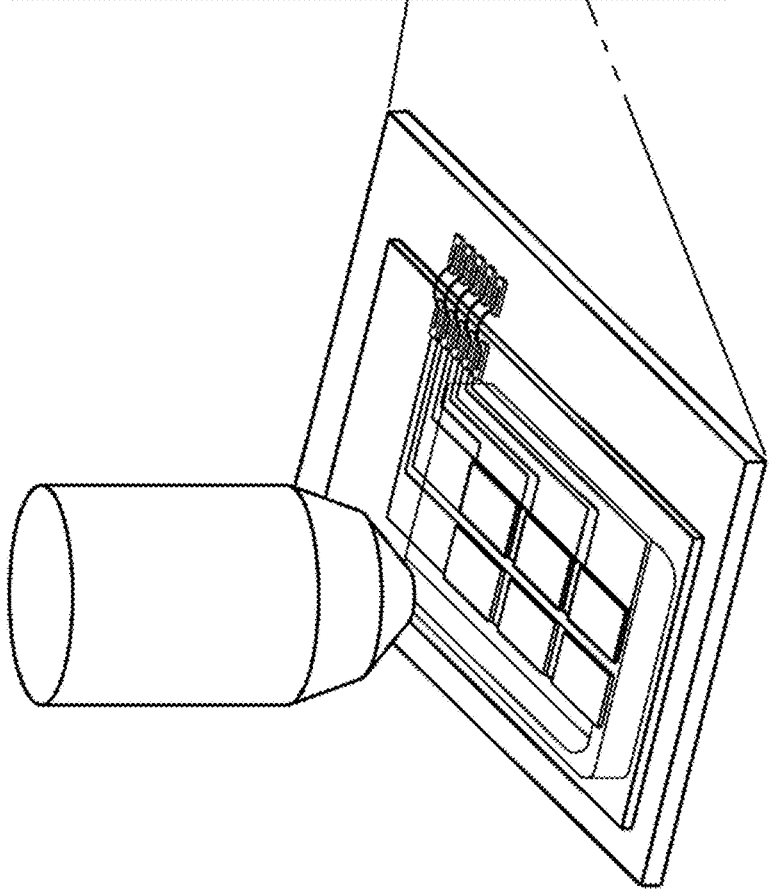

Next, both photoresist-based spectral filters were selectively patterned onto select columns (e.g., pixels) of the 2-by-3 array, creating 3 pairs of pixels which could selectively detect AF555 and Cy5 signals (referred to as AF555 and Cy5 pixels here), respectively. A schematic illustration of a cross-sectional view of the patterned PD pair is shown in FIG. 3. A microscopic view is also shown (bottom). To achieve this, the first filter (Cy5) spun on the PD pair was thermally crosslinked, patterned via a dry etching step, and passivated with a SU8 layer. The process was repeated for the second filter (AF555). The spectrally filtered PD array was then wire-bonded onto a printed circuit board, calibrated, and packaged in a polydimethylsiloxane- (PDMS) based microfluidic channel A schematic illustration and a photograph of the experimental setup using the spectrally filtered PD pair is shown in FIG. 4.

Figure 5A:
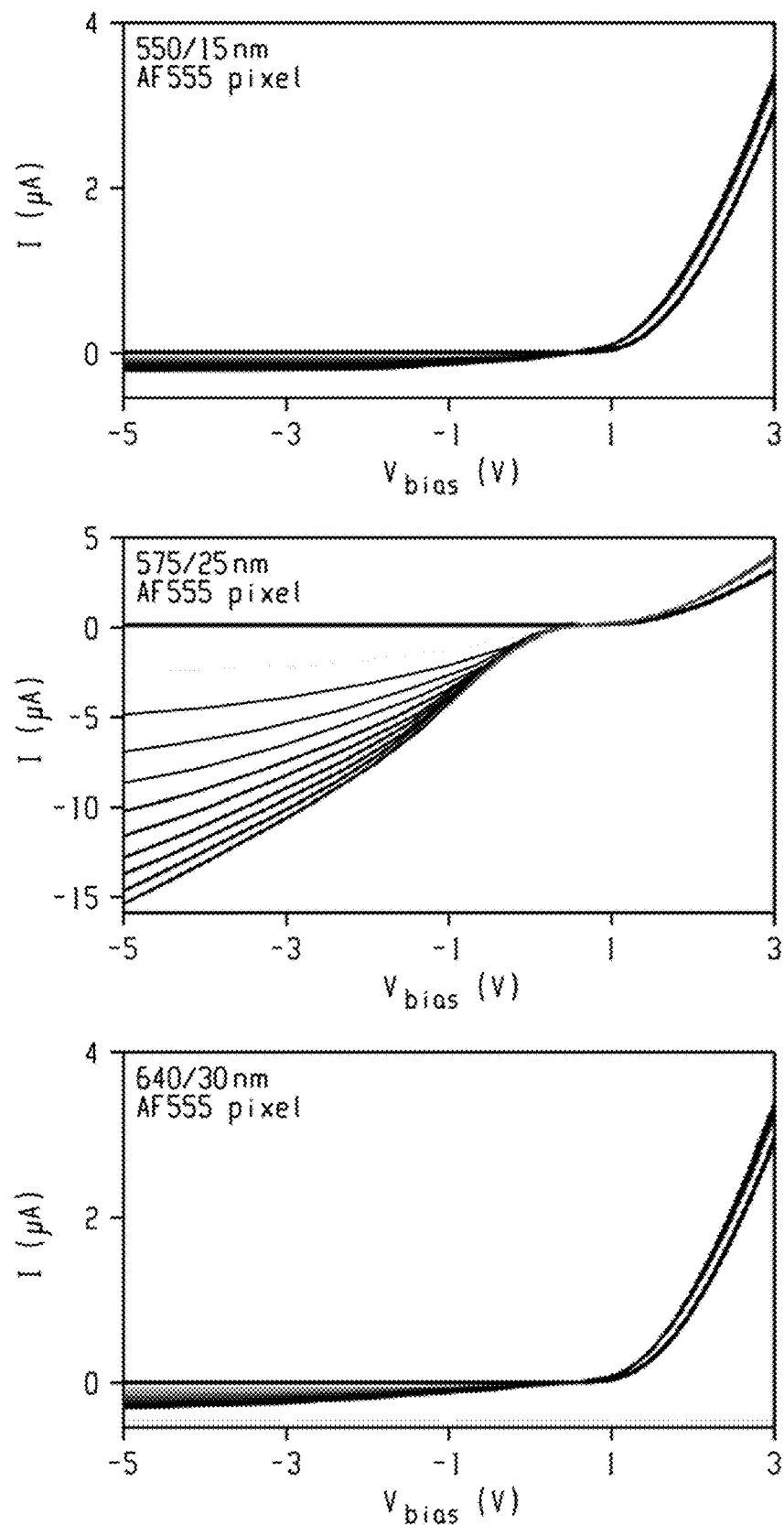
FIG. 5 shows measured I-$V_{bias}$ curves of an AF555 pixel at 3 wavelengths with $I_{light}$ ranging from 10% to 100% (top row) and measured I-$V_{bias}$ curves of Cy5 pixel at 3 wavelengths with $I_{light}$ ranging from 10% to 100% (bottom row). The left, middle, and right columns show measurements under 550/15 nm, 575/25 nm, and 640/30 nm illumination, respectively.
Figure 5B:
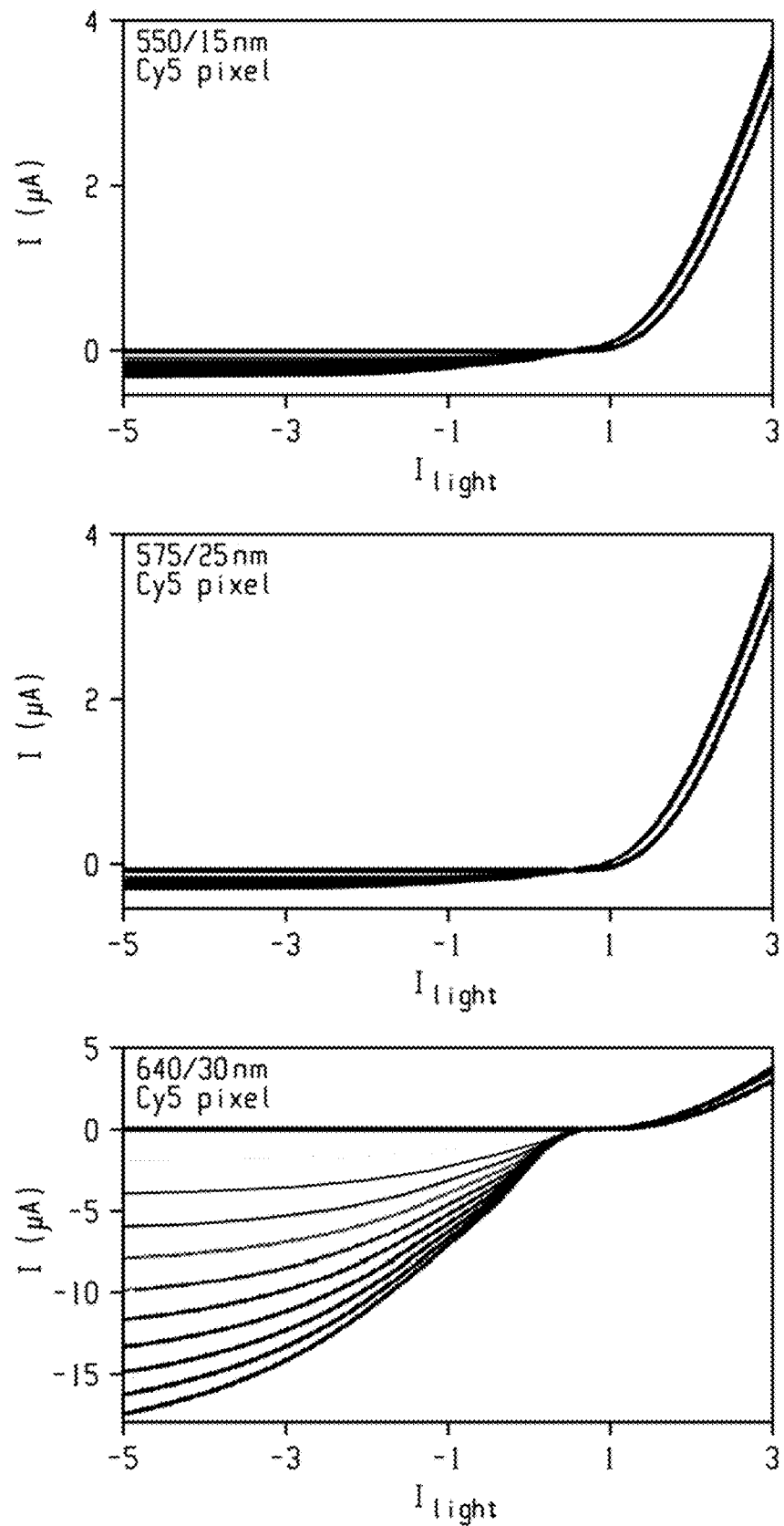
Figure 6:
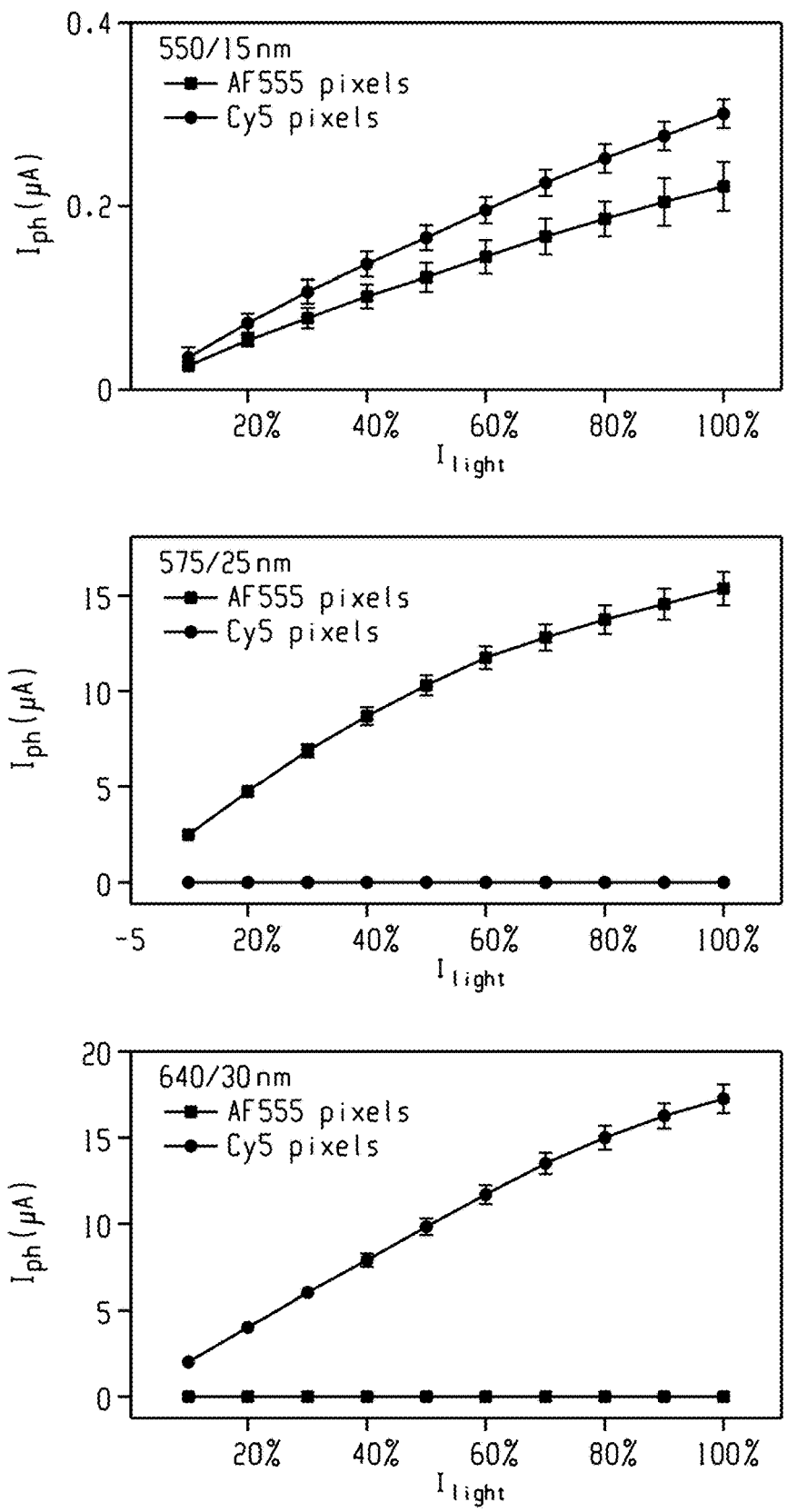
FIG. 6 shows $I_{ph}$ vs $I_{light}$ with pixel pairs biased at $V_{bias}$=−5 V and illuminated at 3 wavelengths. Statistics are based on measurements from 3-pixel pairs. The error bars represent ±1 standard deviation. The left, middle, and right columns show measurements under 550/15 nm, 575/25 nm, and 640/30 nm illumination, respectively.

The wavelength selectivity and the pixel-to-pixel variation of the fabricated array was examined. The current-voltage (I-V) curves of all six filter-integrated pixels (3 AF555 and 3 Cy5 pixels) are shown in FIG. 5. Pixels were biased with $V_{bias}$ ranging from +3V to −5V and illuminated at 550/15 nm (260 mW), 575/25 nm (310 mW), and 640/30 nm (231 mW) wavelengths, with light power ($I_{light}$) ranging from 10% to 100%. These three wavelengths were chosen to characterize the wavelength selectivity as they fall into the excitation spectra and the emission spectra of the AF555 and Cy5 fluorescence molecules, respectively (FIG. 2). We observed that all six pixels showed: 1) a rectified I-V characteristic of p-i-n structured PDs, and 2) a forward turn-on voltage of around 1-1.5 V, likely due to the high doping levels in the α-Si layers or the series resistance of the ITO contact lines. To quantify the effect of the light power ($I_{light}$), the wavelength, and the pixel bias ($V_{bias}$), the photocurrent ($I_{ph}$) was defined as the light-on current subtracted by the dark current measured from each PD pixel (FIG. 6). Notably, the rejection ratios of the AF555 pixel ($I_{575\ nm}/I_{550\ nm}$ and $I_{575\ nm}/I_{640\ nm}$ at $V_{bias}=-5$ V) and the Cy5 pixel ($I_{640\ nm}/I_{550\ nm}$ and $I_{640\ nm}/I_{575\ nm}$ at $V_{bias}=-5$ V) were (70, 50) and (61, 86), respectively, suggesting good wavelength selectivity of the spectrally filtered PD pairs. $V_{bias}=-5$ V was therefore chosen in the rest of this work. It was observed that at $V_{bias}=-5$ V the pixel-to-pixel variation among the 3 AF555 (Cy5) pixels is less than 6% (5%) when $I_{light}$ at 575/15 nm (640/30 nm) is 310/231 mW (100%), suggesting good uniformity across the pixel pairs in detecting the lights of the AF555 and Cy5 molecules.

Figure 7:
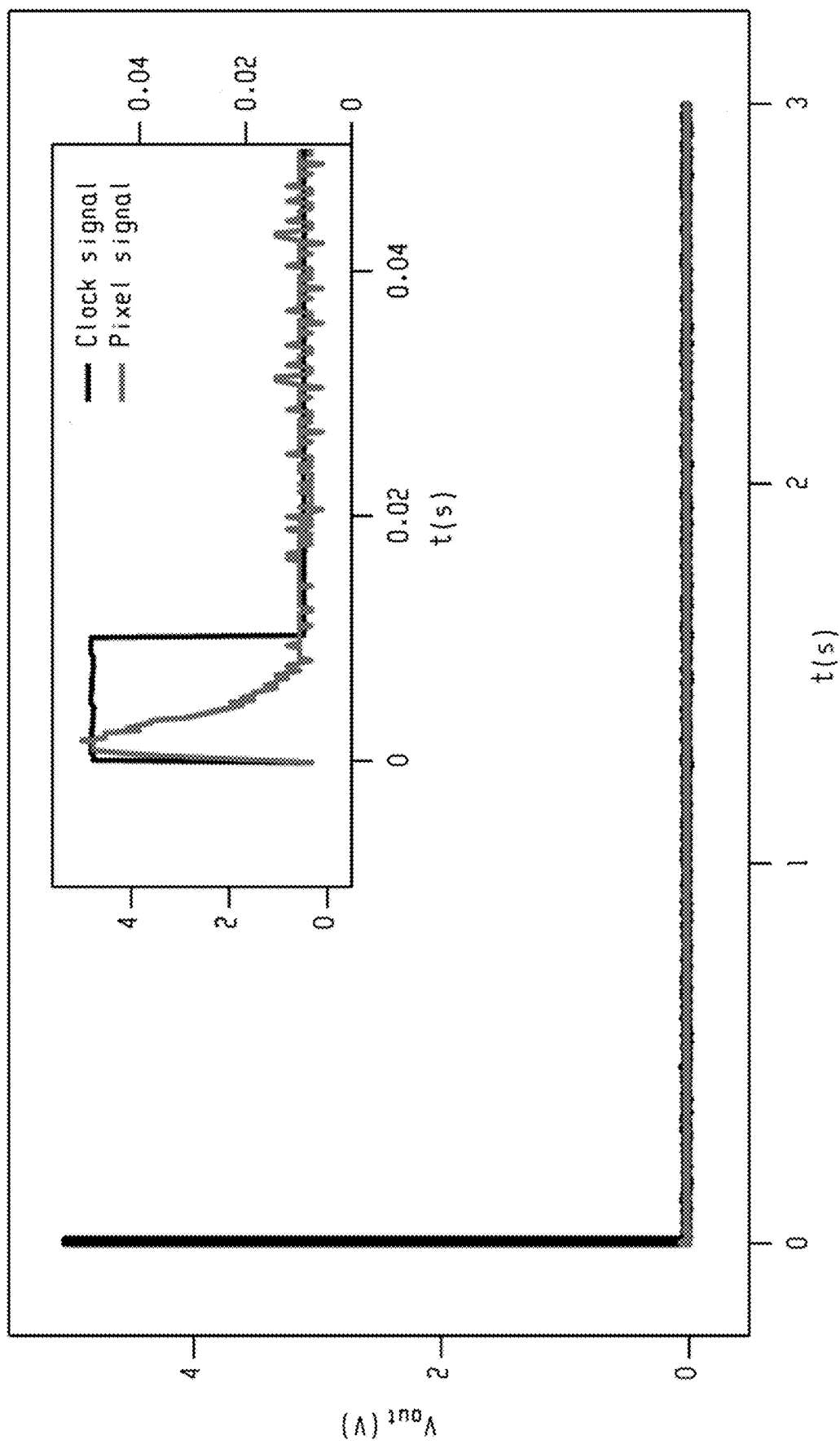
FIG. 7 shows measured 3 s $V_{out}$-trace of one pixel in the dark (0.2 ms per sample) and the clock signal employed for pixel scanning. The pixel signal ($V_{sig}$) is averaged from the data in 0.1 s to 3 s of the $V_{out}$-trace (i.e., 14,500 samples).

Next, the device was characterized for ratiometric aptasensing experiments by building an off-board multiplexing circuit to alternately bias the AF555 and Cy5 pixels at $V_{bias}=-5$ V. Specifically, the photocurrent of each pixel was pre-amplified and filtered (by a 100 Hz low-pass filter) into a voltage readout, $V_{out}$, and then passed through a 50/60 Hz noise eliminator. Using this setup, a 3 s $V_{out}$-trace was sequentially recorded from each pixel using a digital oscilloscope with 256 MS buffer memory (0.2 ms per sample) (FIG. 7). This 3 s sampling time per pixel was selected to let Vow reach the steady state. The steady-state data was averaged from 0.1 s to 3 s of the $V_{out}$-trace (14,500 samples in total).

Figure 8:
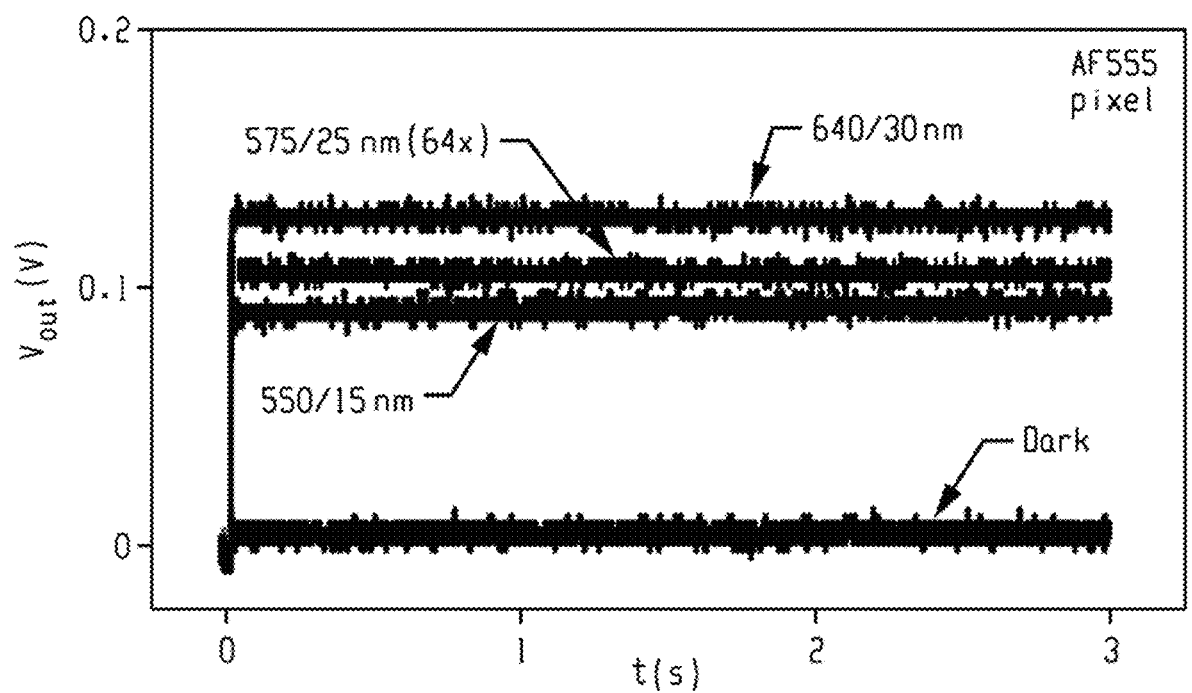
FIG. 8 shows measured 3 s $V_{out}$-traces of representative AF555 (left) and Cy5 (right) pixels illuminated at 550/15 nm, 575/25 nm, and 640/30 nm, all with $I_{light}$ at 100%, and in the dark.
Figure 8:
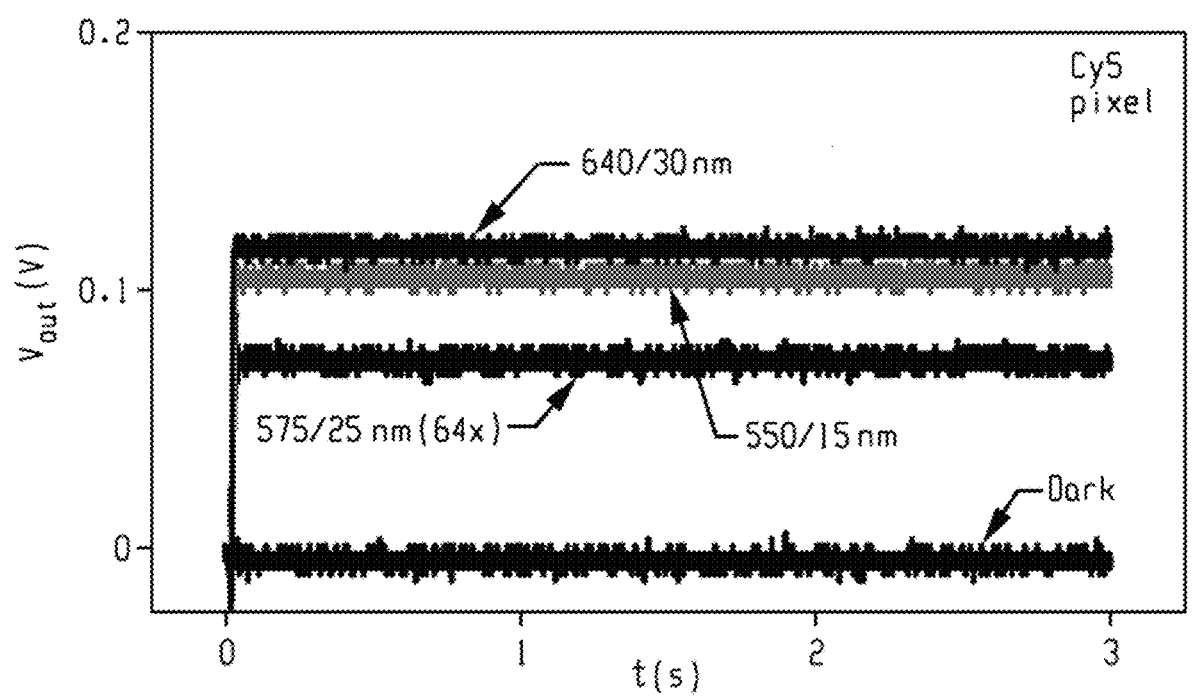
Figure 9:
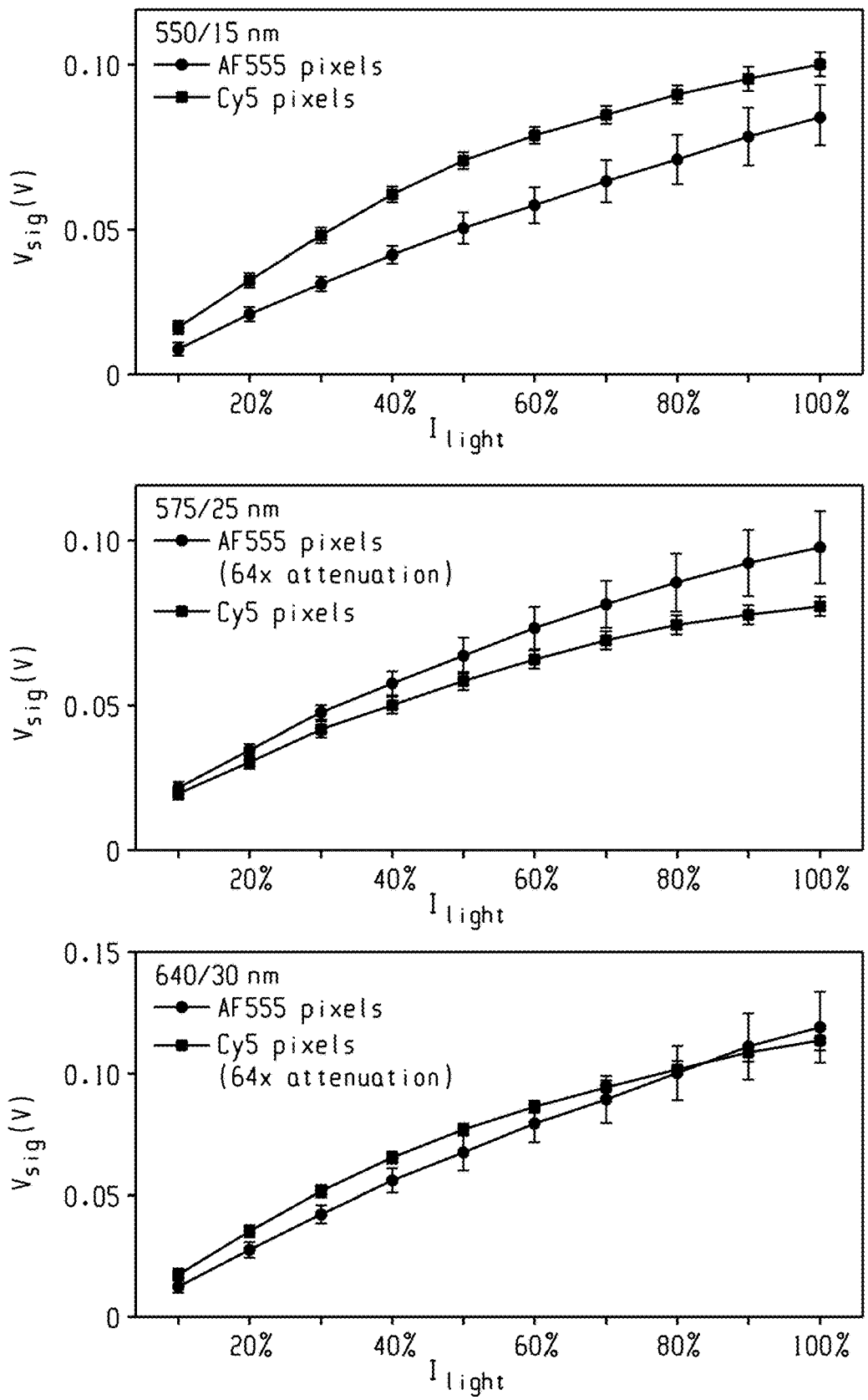
FIG. 9 shows $V_{sig}$ (14,500 frame average per pixel, 3-pixel average) vs $I_{light}$ (100%) under 550/15 nm (left), 575/25 nm (middle), and 640/30 (right) nm illuminations (top row). Measured SBR values under 550/15 nm (left), 575/25 nm (middle), and 640/30 nm (right) illuminations are shown on the bottom row. Dashed lines indicated SBR=3. Statistics are based on measurements from 3-pixel pairs. Error bars represent ±1 s.d. The 575/25 nm and 640/30 nm powers are attenuated 64× for AF555 and Cy5 pixels, respectively.
Figure 9:
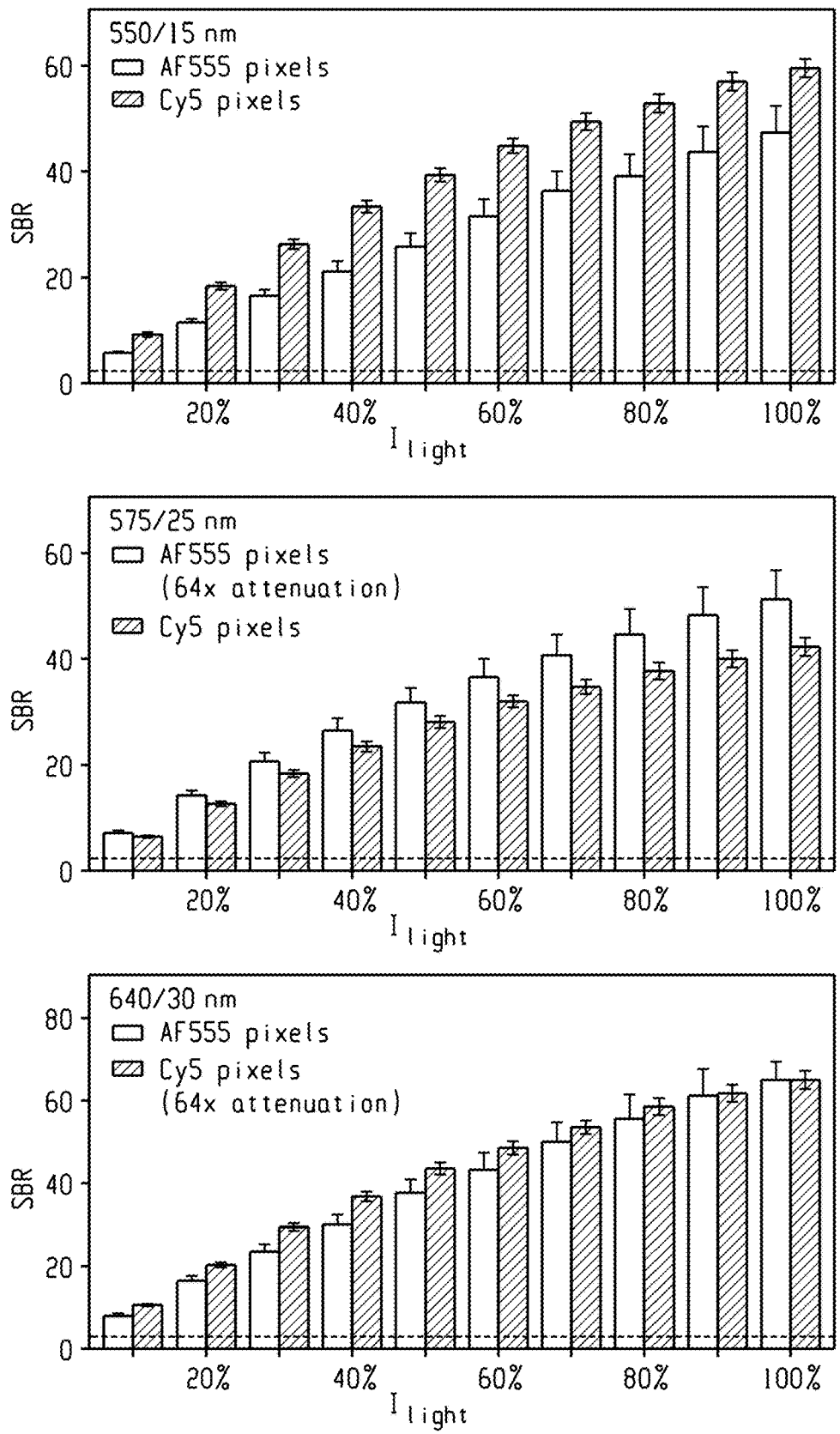

To mimic the relatively weak AF555 and Cy5 emission signals, the 575/25 nm and 640/30 nm light powers were attenuated 64× for AF555 and Cy5 pixels, respectively, which was achieved by using neural-density filters on the microscope (i.e., $I_{light}$ ranges from 0.48 mW (10%) to 4.84 mW (100%) and 0.36 mW (10%) to 3.60 mW (100%) for 575/15 nm and 640/30 nm after attenuation, respectively). $V_{out}$ and $V_{sig}$ values were quantified at various $I_{light}$ values to evaluate the light-detection limit of the array. To this end, 3 s of $V_{out}$ data were collected from each pixel under illumination at 550/15 nm, 575/25 nm, and 640/30 nm, all with $I_{light}$ at 100% (FIG. 8). We found that the $V_{out}$ values under attenuated 575/25 nm (640/30 nm) illumination were comparable to the non-attenuated 550/15 nm and 640/30 nm (575/25 nm) illuminations for the AF555 (Cy5) pixel, highlighting the wavelength selectivity of our spectrally filtered array (FIG. 8). To evaluate the linearity of the array, the $V_{sig}$ values were averaged at various $I_{light}$ values for each pixel (14,500 samples per pixel) under illumination at 550/15 nm, 575/25 nm, and 640/30 nm, all with $I_{light}$ ranging from 10% to 100%. The measurements of each pixel (3 pixels average) were then averaged at each light power (FIG. 9). The results showed good linearity for all three wavelengths in each pixel. Further, the signal-to-background ratio SBR for all six pixels was determined, where SBR is defined as the mean $V_{sig}$ value under illumination divided by the standard deviation of the $V_{sig}$ value in the dark. It was observed that the AF555 (Cy5) pixels obtained comparable or higher SBR under attenuated 575/25 nm (640/30 nm) illumination than under the non-attenuated 550/15 nm illumination. Notably, AF555 (Cy5) pixels obtained SBR values greater than 3 at 575/25 nm (640/30 nm) for $I_{light}$ down to 0.48 mW (0.36 mw), highlighting the low light intensity detection limit of the present array.

To package the PD array for ratiometric aptasensing experiments, a 50 μm tall PDMS microfluidic channel with one inlet and one outlet hole was fabricated via a standard SU-8 photolithography process, and then bonded the microfluidic channel over the PD array via $O_2$ plasma. Tubing was inserted into the inlet and outlet holes to allow for injection and removal of analytes. To achieve ratiometric aptasensing without the use of labels, the surface of the array was functionalized by sequentially introducing BSA, AF555 conjugated streptavidin, and biotinylated Cy5 labeled IFN-γ DNA aptamers. After each analyte's respective incubation period, the extra unbonded analyte was removed by washing with 9 mL deionized water.

Following this surface functionalization procedure, two aptasensing experiments were conducted where, in each experiment, the device was kept in 1×PBS and sequentially introduced 0.1 pM-1 nM analyte in 15-minute intervals followed by a water washing step and reintroduced analytes and water washing as 2nd round via the microfluidic channel (FID. 10*a-c*). During introducing each concentration, an upright fluorescence microscope was used to illuminate the PD array with pulses of 550/15 nm excitation light ($I_{light}$=100%, 260 mW) which have $t_{on}/t_{off}$=18/162 s (i.e., 3 min period) to alleviate the photobleaching effect.

Figure 10A:
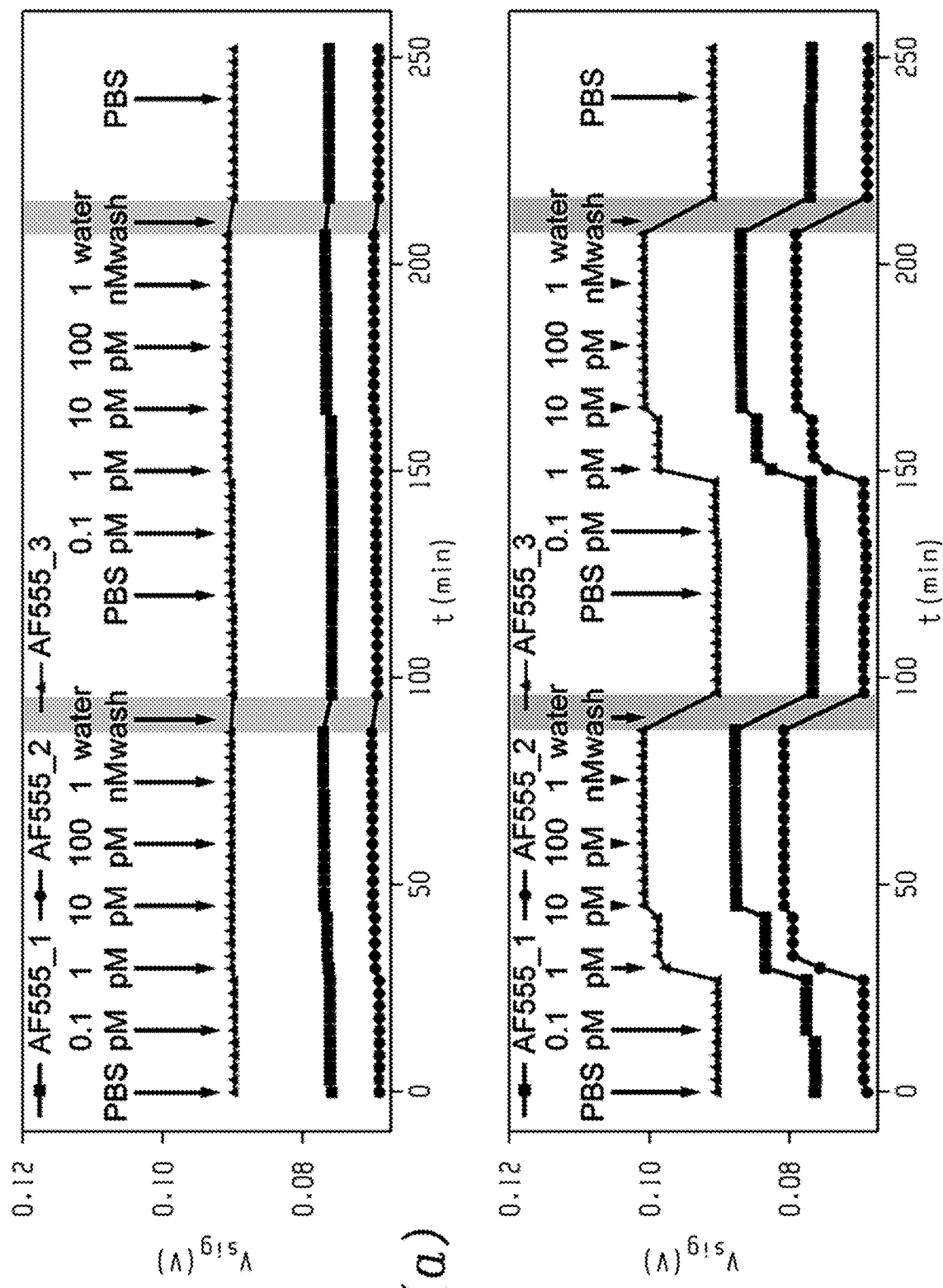
FIG. 10 shows (a) measured $V_{sig}$-trace of 3 AF555 pixels with 0.1 pM-1 nM streptavidin (left) or IFN-γ (right) being sequentially introduced, washed away, and reintroduced to each pixel. Grey zones represent the water washing step; (b) measured $V_{sig}$-trace of 3 Cy5 pixels with 0.1 pM-1 nM streptavidin (left) or IFN-γ (right) being sequentially introduced, washed away, and reintroduced to each pixel. Grey zones represent the water washing step; and (c) shows ratiometric readout trace of each PD pair (normalized $V_{sig\_AF555}/V_{sig\_Cy5}$) for streptavidin adding (left) or IFN-γ adding (right). Grey zones represent the water washing step.
Figure 10B:
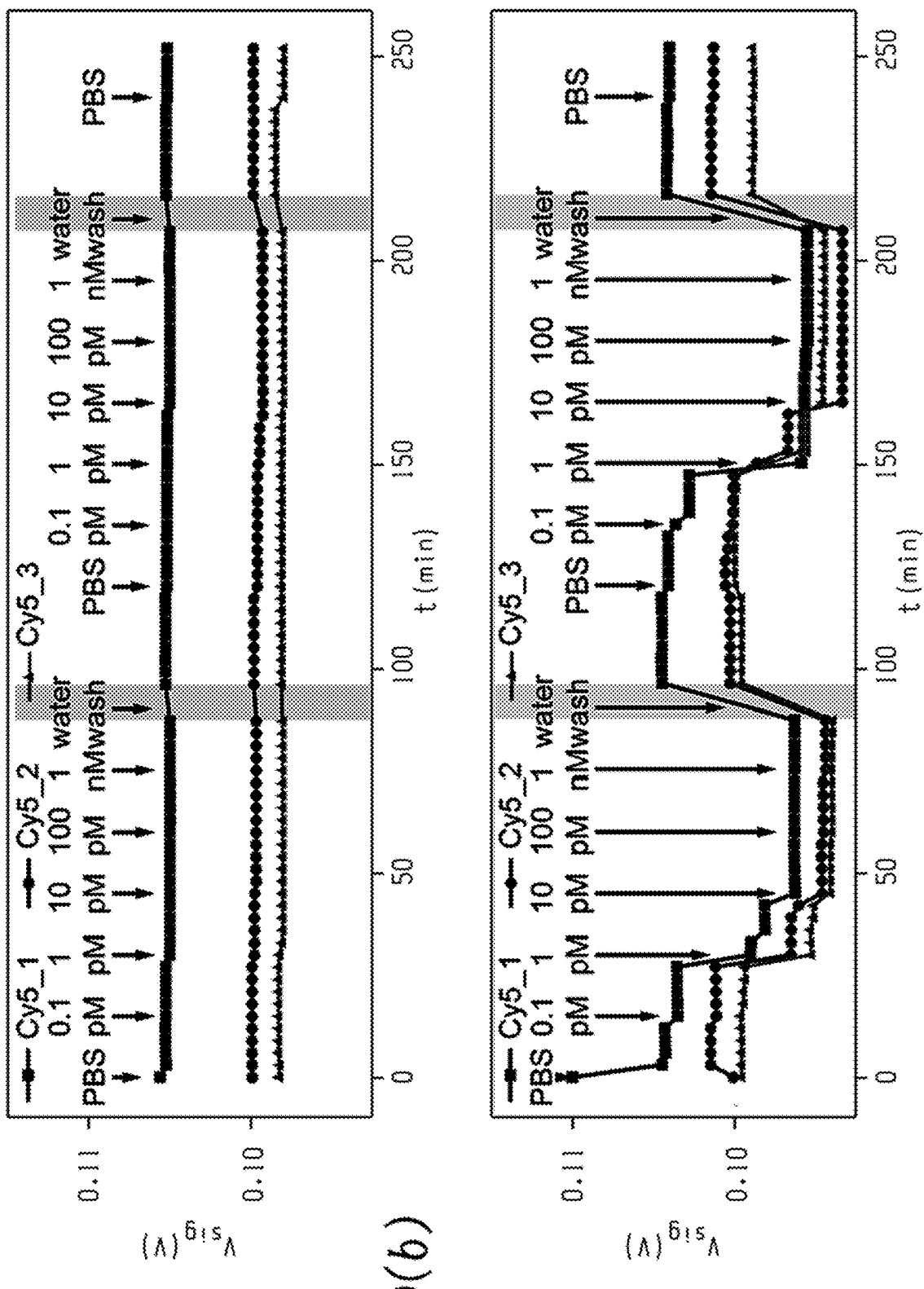

For the first experiment, streptavidin was sequentially introduced as a control to evaluate the specificity of the array. Insignificant (<5%) change was observed in the resulting AF555 and Cy5 pixel signals (FIG. 10*a* (left) and FIG. 10*b* (left)) since streptavidin does not bind to the aptamer, highlighting the good specificity of our array. For the second experiment, IFN-γ was sequentially introduced to evaluate the sensibility of the array. As the IFN-γ concentration increased from 0.1 pM to 10 pM, it was found that the pixel signal $V_{sig}$ increased [decreased] in AF555 [Cy5] pixels among all 3 PD pairs and reached a steady state in 6 minutes (FIG. 10*a* (right) and FIG. 10*b* (right)). This response suggests a change in DNA aptamer conformation due to aptamer-IFN-γ binding events, which separated the AF555 and Cy5 molecules and lessened the FRET effect. Due to this conformation change, less AF555 emission light will excite the Cy5 molecules, leading to the observed increase [decrease] in AF555 [Cy5] pixel signals. This low limit-of-detection (1 pM) indicates that the DNA aptamers have a very high binding affinity for IFN-γ, which is crucial for monitoring physiological IFN-γ dynamics in immune response applications. Furthermore, no significant change was observed in either pixels' $V_{sig}$ when 100 pM to 1 nM IFN-γ was introduced, likely due to the DNA aptamers on the PD pixels being saturated by the IFN-γ already bonded to them.

Figure 10C:
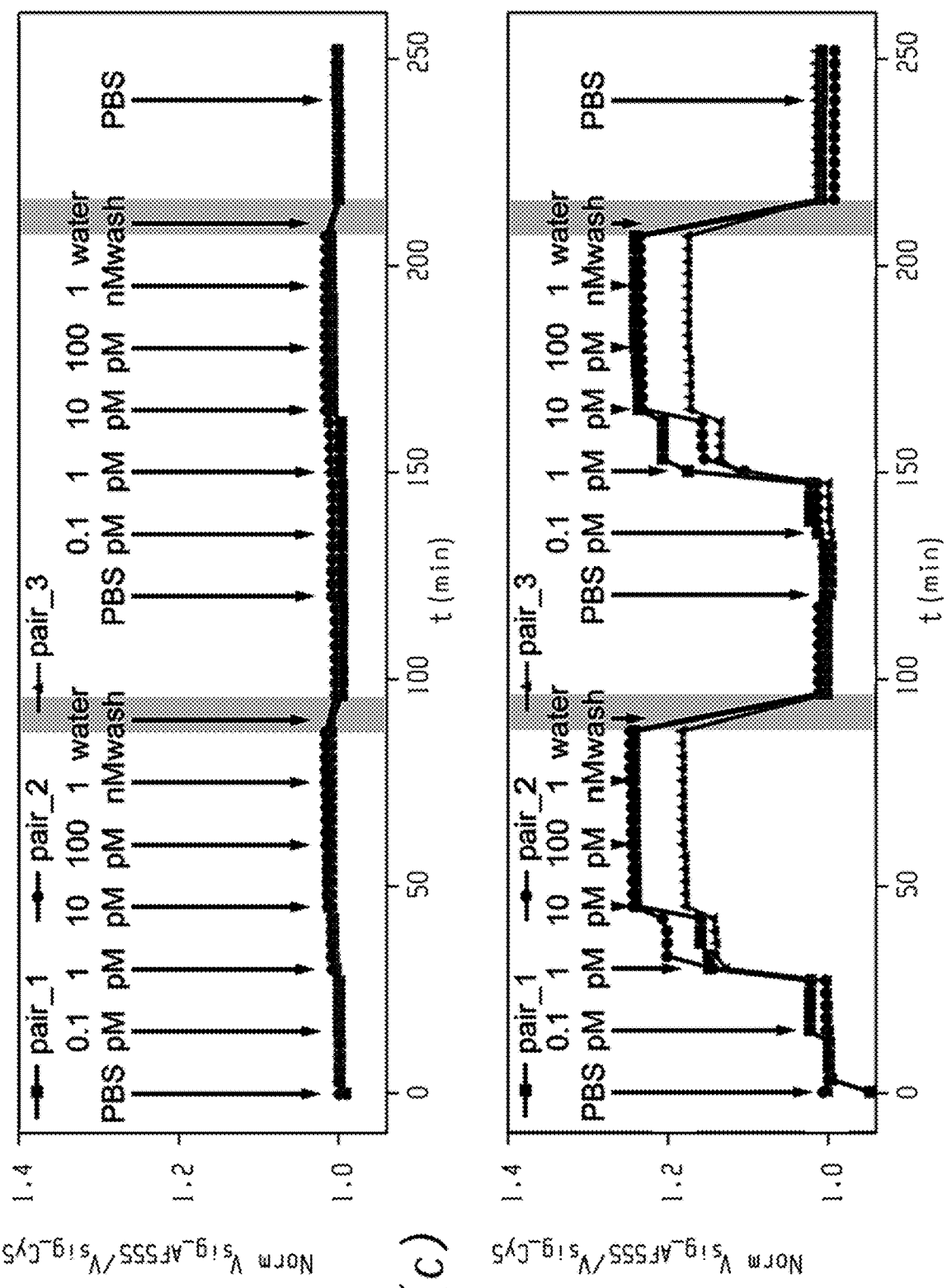
Figure 11:
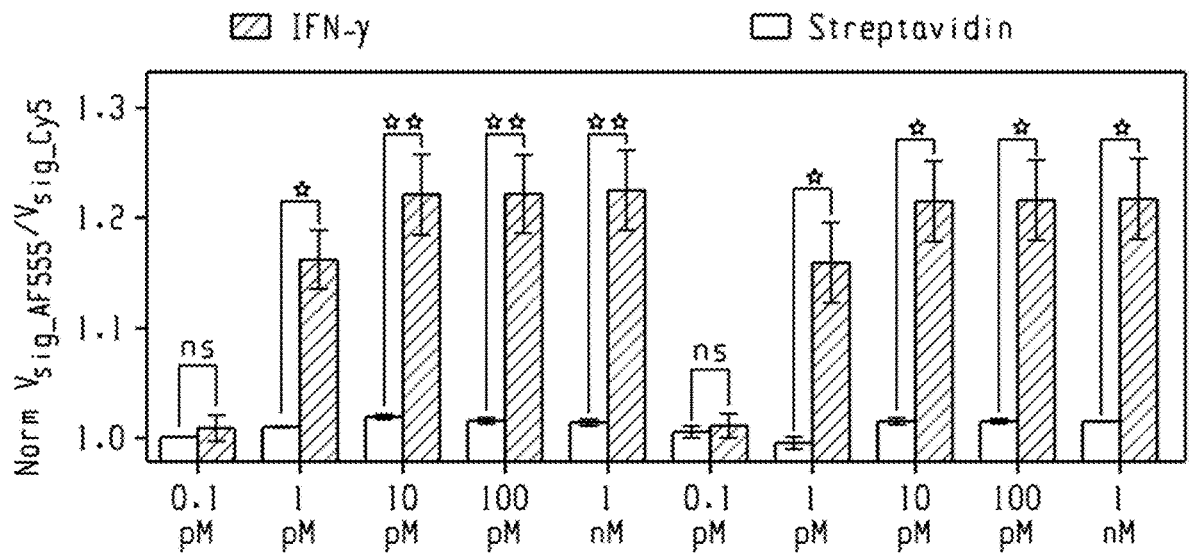
FIG. 11 shows the ratiometric readout (normalized $V_{sig\_AF555}/V_{sig\_Cy5}$) vs. concentration for both streptavidin and IFN-γ adding. Statistics are based on measurements from three PD pairs; Errors bars represent ±1 s.d.; n.s.p>0.05, *p<0.05, **p<0.01.

To further quantify the change in $V_{sig}$ from both AF555 and Cy5 pixels, a ratiometric process was applied by normalizing $V_{sig\_AF555}/V_{sig\_Cy5}$ to the baseline (initial $V_{sig}$ value in the 1×PBS before adding analyte) (FIG. 10*c* and FIG. 11). The results clearly show that the spectrally filtered PD array ratiometrically monitored the IFN-γ dynamics at pM levels in a label free manner, highlighting its promise for applications requiring timely immune response monitoring.

Figure 12:
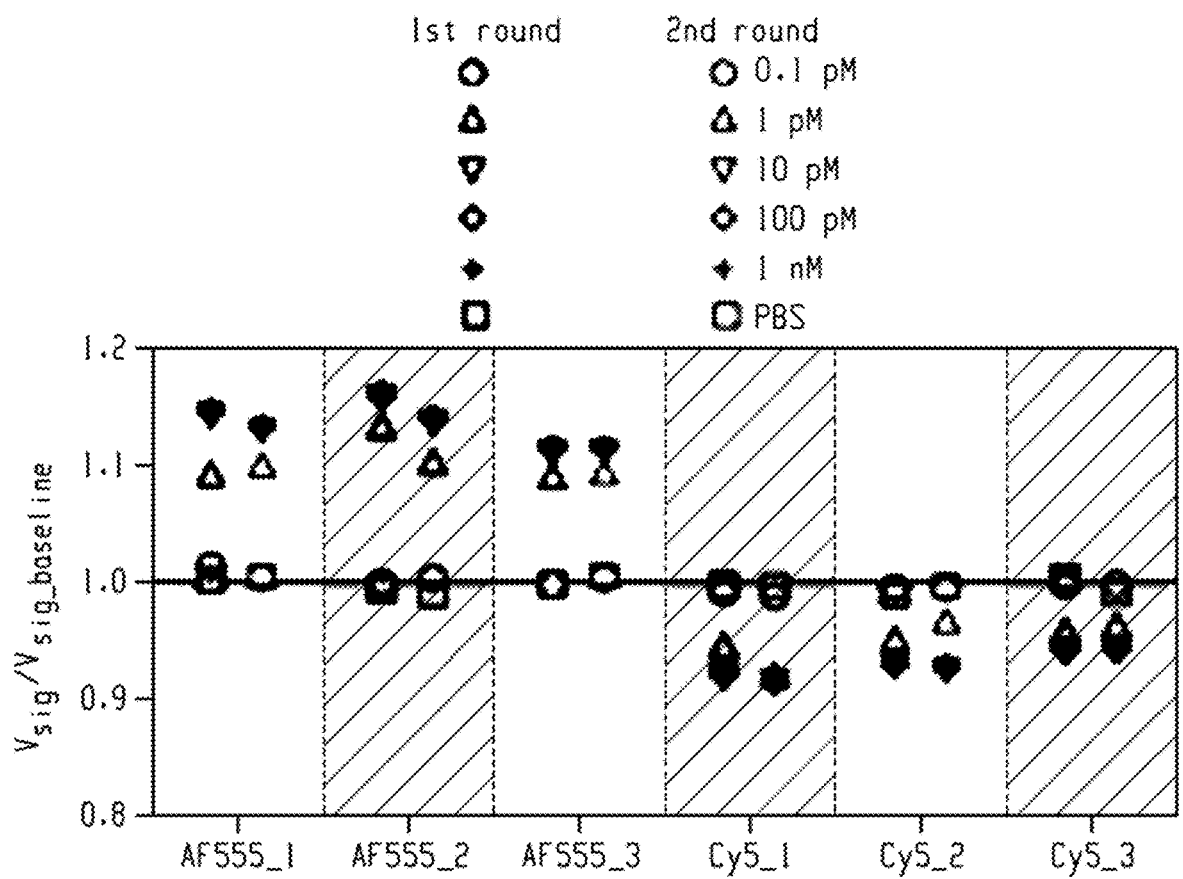
FIG. 12 shows comparison of $V_{sig}/V_{sig\_baseline}$ of each PD pixel in $1^{st}$ and $2^{nd}$ round analytes adding.
Figure 13A:
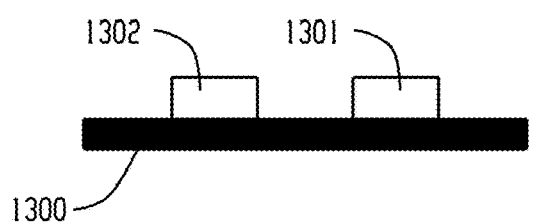
FIG. 13 is a schematic illustration of a method of making the spectrally filtered photodiode pair according to an aspect.
Figure 13B:
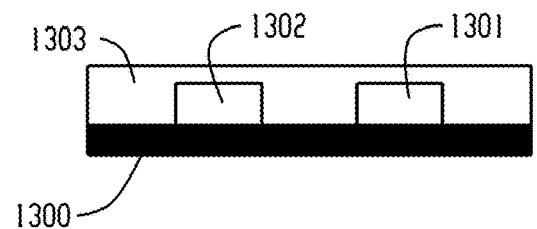
Figure 13C:
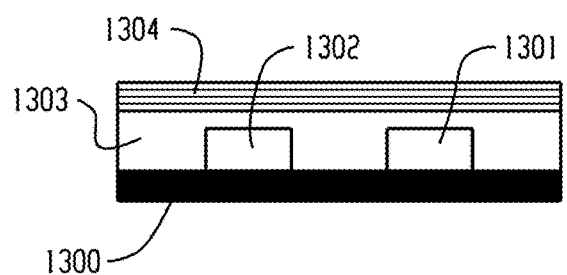
Figure 13D:
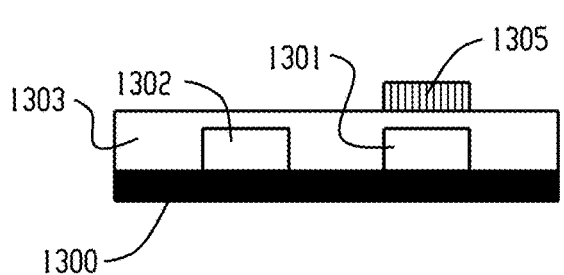
Figure 13H:
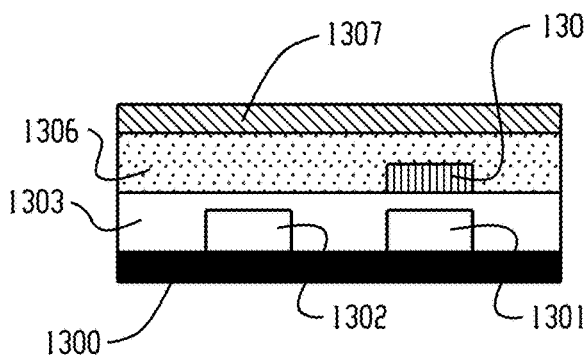
Figure 13G:
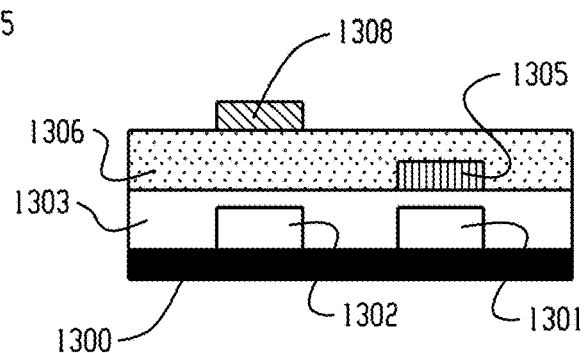
Figure 13F:
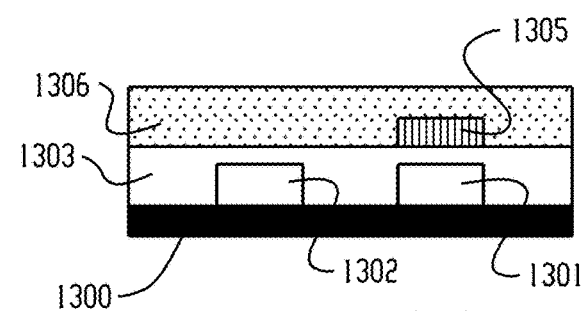
Figure 13E:
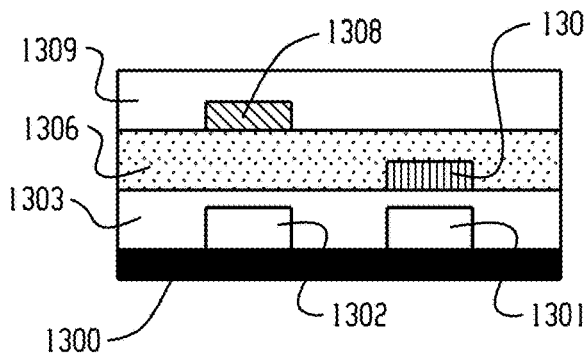

To investigate the reusability of the sensing system, the water washing steps were conducted (grey regions in FIG. 10*a-c*) and a second round of sequential analyte introduction in both experiments. After adding 1×PBS following the first round of water washing, it was found that the pixel signal $V_{sig}$ returned to within 5% of the baseline value among the entire array. Furthermore, by comparing the $V_{sig}/V_{baseline}$ of the array at each analyte concentration (FIG. 12), high similarity between measurements obtained in both rounds was observed, suggesting the good chemical stability of the device.

Accordingly, described herein is an on-chip ratiometric aptasensing device to monitor the dynamics of an essential immune response biomarker, IFN-γ, in a label-free manner. The device is formed by a pair of spectrally filtered silicon photodiodes (PD) that are surface functionalized by aptamer probes, which can rapidly detect two-color fluorescence changes resulting from the aptamer-cytokine binding events within 5 minutes at picomolar (pM) levels. Such limit-of-detection (LOD) is on par with prior electrochemical and optical cytokine sensors, and sufficient to capture the cytokine transients in POC settings. Importantly, it has been shown that the present PD pairs can be reset to the original baseline by simple washing steps, yielding consistent readout in consecutive runs. Combined with its chip-scale construct and high specificity, the present device may be ultimately integrated in bedside blood testing systems for a variety of health monitoring and therapeutic screening uses.

This disclosure further encompasses the following aspects.

Aspect 1: A spectrally filtered photodiode pair comprising a substrate having a first photodiode and a second photodiode disposed thereon, wherein the first photodiode is positioned adjacent to the second photodiode; a first spectral filter positioned over the first photodiode; and a second spectral filter positioned over the second photodiode; wherein the first spectral filter comprises a first absorbing dye composition capable of absorbing light at a first wavelength, absorbing light at a second wavelength, and passing light at a third wavelength that is different from the first and second wavelengths; and wherein the second spectral filter comprises a second absorbing dye composition capable of absorbing light at the first wavelength, passing light at the second wavelength; and absorbing light at the third wavelength.

Aspect 2: The spectrally filtered photodiode pair of aspect 1, comprising the substrate having the first photodiode and the second photodiode disposed thereon, wherein the first photodiode and the second photodiode each comprise a p-i-n amorphous silicon layer; a first passivation layer disposed on the substrate and encompassing the first and second photodiodes; the first spectral filter disposed on the first passivation layer and positioned over the first photodiode; a second passivation layer disposed on the first spectral filter and on exposed portions of the first passivation layer; the second spectral filter disposed on the second passivation layer and positioned over the second photodiode; and a third passivation layer disposed on the second spectral filter and on exposed portions of the second passivation layer.

Aspect 3: The spectrally filtered photodiode pair of aspect 1 or 2, wherein the substrate comprises silicon, silicon oxide, or a combination thereof, preferably a combination of silicon and silicon oxide.

Aspect 4: The spectrally filtered photodiode pair of any of aspects 1 to 3, wherein the first photodiode and the second photodiode are separated by a horizontal distance of 1 to 50 μm, or 5 to 30 μm, or 10 to 25 μm, or 15 to 25 μm.

Aspect 5: The spectrally filtered photodiode pair of any of aspects 1 to 4, wherein the first wavelength is 550±15 nanometers, the second wavelength is 666±15 nanometers, and the third wavelength is 580±15 nanometers.

Aspect 6: The spectrally filtered photodiode pair of any of aspects 1 to 5, wherein the first absorbing dye composition comprises a first absorbing dye having an absorption maximum at 540 to 550 nanometers; a second absorbing dye having an absorption maximum at 630 to 640 nanometers; a third absorbing dye having an absorption maximum at 665 to 675 nanometers; and a photoresist; preferably wherein the first absorbing dye composition comprises 1 to 5 weight percent of the first absorbing dye; 0.1 to 1 weight percent of the second absorbing dye; 1 to 5 weight percent of the third absorbing dye; and 89 to 97.9 weight percent of the photoresist; wherein weight percent is based on the total weight of the second absorbing dye composition.

Aspect 7: The spectrally filtered photodiode pair of any of aspects 1 to 6, wherein the second absorbing dye composition comprises a first absorbing dye having an absorption maximum at 540 to 550 nanometers; a second absorbing dye having an absorption maximum at 570 to 580 nanometers; and a photoresist; preferably wherein the second absorbing dye composition comprises 1 to 5 weight percent of the first absorbing dye; 1 to 5 weight percent of the second absorbing dye; and 90 to 98 weight percent of the photoresist; wherein weight percent is based on the total weight of the first absorbing dye composition.

Aspect 8: The spectrally filtered photodiode pair of any of aspects 1 to 7, wherein each passivation layer is the same or different, preferably wherein each passivation layer is the same, and comprises an epoxy-containing compound.

Aspect 9: The spectrally filtered photodiode pair of any of aspects 1 to 8, wherein the first spectral filter and the second spectral filter are each independently crosslinked.

Aspect 10: A photodiode array comprising the spectrally filtered photodiode pair of any of aspects 1 to 9, preferably comprising a plurality of the spectrally filtered photodiode pairs of any of aspects 1 to 9.

Aspect 11: A method of making the spectrally filtered photodiode pair of any of aspects 1 to 9, the method comprising disposing the first passivation layer on a surface of the substrate and encompassing the first and second photodiodes; disposing the first absorbing dye composition on the first passivation layer to provide a first spectral layer; heating the first spectral layer under conditions effective to thermally crosslink the first spectral layer; selectively patterning the first spectral layer to provide the first spectral filter positioned over the first photodiode; disposing a second passivation layer on the first spectral filter and on exposed portions of the first passivation layer, disposing the second absorbing dye composition on the second passivation layer to provide a second spectral layer; heating the second spectral layer under conditions effective to thermally crosslink the first spectral layer, selectively patterning the second spectral layer to provide the second spectral filter positioned over the second photodiode; and disposing a third passivation layer on the second spectral filter and on exposed portions of the second passivation layer.

Aspect 12: A device comprising the spectrally filtered photodiode pair of any of aspects 1 to 9 or the photodiode array of aspect 10, preferably wherein the device is a biosensor, more preferably wherein the device is an aptasensor.

Aspect 13: The device of aspect 12, wherein the device is an aptasensor comprising an aptamer disposed on the spectrally filtered photodiode pair, wherein the aptamer comprises a first fluorescent dye and a second fluorescent dye, wherein the first fluorescent dye and the second fluorescent dye are capable of forming a Forster resonance energy transfer (FRET) pair such that: the second fluorescent dye is capable of being excited by light at the first wavelength and emitting light at the third wavelength; and the first fluorescent dye is capable of being excited by light at the third wavelength emitted from the second fluorescent dye, and emitting light at the second wavelength; and wherein the first fluorescent dye and the second fluorescent dye are located at opposing ends of the aptamer.

Aspect 14: The device of aspect 13, wherein the aptasensor comprises biotinylated bovine serum albumin adsorbed on a surface of the spectrally filtered photodiode pair; streptavidin comprising the second fluorescent dye bound to the biotinylated bovine serum albumin; and a biotinylated DNA aptamer bound to the streptavidin, the DNA aptamer comprising the first fluorescent dye at an end of the DNA aptamer opposite the streptavidin.

Aspect 15: The device of aspect 14, wherein the DNA aptamer is specific to a cytokine, preferably wherein the DNA aptamer is specific to interferon gamma.

Aspect 16: The device of any of aspects 13 to 15, wherein the second wavelength of light emitted by the first fluorescent dye is a wavelength of 666±15 nanometers, preferably wherein the first fluorescent dye comprises a cyanine dye, preferably cyanine 5 or cyanine 7.

Aspect 17: The device of any of aspects 13 to 16, wherein the third wavelength of light emitted by the second fluorescent dye is a wavelength of 580±15 nanometers; preferably wherein the second fluorescent dye is of the structure

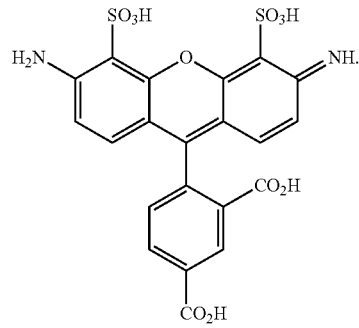 [SMILES: N=c1ccc2c(-c3ccc(C(=O)O)cc3C(=O)O)c3ccc(N)c(S(=O)(=O)O)c3oc-2c1S(=O)(=O)O]

Aspect 18: The device of any of aspects 12 to 17, further comprising a microfluidic channel, wherein the microfluidic channel is configured to provide a sample to be analyzed to the spectrally filtered photodiode pair.

Aspect 19: A method of detecting a biological moiety in a sample, the method comprising exposing the device of any of aspects 13 to 18 to the sample, wherein the DNA aptamer of the device is specific to the biological moiety; and determining a ratio of the second wavelength of light emitted by the first fluorescent dye to the third wavelength of light emitted by the second fluorescent dye; wherein a change in the ratio relative to an initial ratio of the second wavelength of light emitted by the first fluorescent dye to the third wavelength of light emitted by the second fluorescent dye determined in the absence of the sample indicates the presence of the biological moiety.

Aspect 20: The method of aspect 19, wherein the biological moiety is a cytokine, preferably interferon gamma.

Aspect 21: The method of aspect 19 or 20, further comprising resetting the device and subsequently exposing the device to a second sample.

Various embodiments are shown in the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, or sections, these elements, components, regions, layers, or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" or "including" when used in this specification, specify the presence of stated features, regions, integers, steps, operations, elements, or components, but do not preclude the presence or addition of one or more other features, regions, integers, steps, operations, elements, components, or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

While a particular embodiment has been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A spectrally filtered photodiode pair comprising
   a substrate having a first photodiode and a second photodiode disposed thereon, wherein the first photodiode is positioned adjacent to the second photodiode;
   a first spectral filter positioned over the first photodiode; and
   a second spectral filter positioned over the second photodiode;
   wherein the first spectral filter comprises
      a first absorbing dye composition capable of
      absorbing light at a first wavelength,
      absorbing light at a second wavelength, and
      passing light at a third wavelength that is different from the first and second wavelengths; and
   wherein the second spectral filter comprises
      a second absorbing dye composition capable of
      absorbing light at the first wavelength,
      passing light at the second wavelength; and
      absorbing light at the third wavelength.

2. The spectrally filtered photodiode pair of claim 1, comprising
   the substrate having the first photodiode and the second photodiode disposed thereon, wherein the first photodiode and the second photodiode each comprise a p-i-n amorphous silicon layer;
   a first passivation layer disposed on the substrate and encompassing the first and second photodiodes;
   the first spectral filter disposed on the first passivation layer and positioned over the first photodiode;
   a second passivation layer disposed on the first spectral filter and on exposed portions of the first passivation layer;
   the second spectral filter disposed on the second passivation layer and positioned over the second photodiode; and
   a third passivation layer disposed on the second spectral filter and on exposed portions of the second passivation layer.

3. The spectrally filtered photodiode pair of claim 1, wherein the substrate comprises silicon, silicon oxide, or a combination thereof.

4. The spectrally filtered photodiode pair of claim 1, wherein the first photodiode and the second photodiode are separated by a distance of 1 to 50 m.

5. The spectrally filtered photodiode pair of claim 1, wherein
   the first wavelength is 550 15 nanometers,
   the second wavelength is 666±15 nanometers, and
   the third wavelength is 580±15 nanometers.

6. The spectrally filtered photodiode pair of claim 1, wherein the first absorbing dye composition comprises
   a first absorbing dye having an absorption maximum at 540 to 550 nanometers;
   a second absorbing dye having an absorption maximum at 630 to 640 nanometers;
   a third absorbing dye having an absorption maximum at 665 to 675 nanometers; and
   a photoresist.

7. The spectrally filtered photodiode pair of claim 1, wherein the second absorbing dye composition comprises
   a first absorbing dye having an absorption maximum at 540 to 550 nanometers;

a second absorbing dye having an absorption maximum at 570 to 580 nanometers; and a photoresist.

8. The spectrally filtered photodiode pair of claim 1, wherein each passivation layer is the same or different.

9. The spectrally filtered photodiode pair of claim 1, wherein the first spectral filter and the second spectral filter are each independently crosslinked.

10. A photodiode array comprising the spectrally filtered photodiode pair of claim 1.

11. An aptasensor comprising an aptamer disposed on the spectrally filtered photodiode pair of claim 1, wherein the aptamer comprises a first fluorescent dye and a second fluorescent dye, wherein the first fluorescent dye and the second fluorescent dye are capable of forming a Forster resonance energy transfer (FRET) pair such that:

the second fluorescent dye is capable of being excited by light at the first wavelength and emitting light at the third wavelength; and the first fluorescent dye is capable of being excited by light at the third wavelength emitted from the second fluorescent dye, and emitting light at the second wavelength; and wherein the first fluorescent dye and the second fluorescent dye are located at opposing ends of the aptamer.

12. The device of claim 11, wherein the second wavelength of light emitted by the first fluorescent dye is a wavelength of 666+15 nanometers.

13. The device of claim 11, wherein the third wavelength of light emitted by the second fluorescent dye is a wavelength of 580±15 nanometers.

14. The device of claim 11, further comprising a microfluidic channel, wherein the microfluidic channel is configured to provide a sample to be analyzed to the spectrally filtered photodiode pair.

15. The device of claim 11, wherein the aptasensor comprises biotinylated bovine serum albumin adsorbed on a surface of the spectrally filtered photodiode pair;

streptavidin comprising the second fluorescent dye bound to the biotinylated bovine serum albumin; and a biotinylated DNA aptamer bound to the streptavidin, the DNA aptamer comprising the first fluorescent dye at an end of the DNA aptamer opposite the streptavidin.

16. The device of claim 15, wherein the DNA aptamer is specific to a cytokine.

17. A method of detecting a biological moiety in a sample, the method comprising exposing the device of claim 11 to the sample, wherein the DNA aptamer of the device is specific to the biological moiety; and determining a ratio of the second wavelength of light emitted by the first fluorescent dye to the third wavelength of light emitted by the second fluorescent dye;

wherein a change in the ratio relative to an initial ratio of the second wavelength of light emitted by the first fluorescent dye to the third wavelength of light emitted by the second fluorescent dye determined in the absence of the sample indicates the presence of the biological moiety.

18. The method of claim 17, wherein the biological moiety is a cytokine.

* * * * *